US009406697B1

(12) United States Patent
Liu et al.

(10) Patent No.: US 9,406,697 B1
(45) Date of Patent: Aug. 2, 2016

(54) SEMICONDUCTOR DEVICES AND MANUFACTURING METHODS THEREOF

(71) Applicant: Taiwan Semiconductor Manufacturing Company, Ltd., Hsin-Chu (TW)

(72) Inventors: Chee-Wee Liu, Taipei (TW); Hung-Chih Chang, Taichung (TW); Cheng-Yi Peng, Taipei (TW); Chih-Sheng Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/601,084

(22) Filed: Jan. 20, 2015

(51) Int. Cl.
| | | |
|---|---|---|
| *H01L 21/70* | (2006.01) | |
| *H01L 27/12* | (2006.01) | |
| *H01L 27/092* | (2006.01) | |
| *H01L 29/06* | (2006.01) | |
| *H01L 21/8238* | (2006.01) | |
| *H01L 21/84* | (2006.01) | |

(52) U.S. Cl.
CPC .... *H01L 27/1211* (2013.01); *H01L 21/823821* (2013.01); *H01L 21/845* (2013.01); *H01L 27/0924* (2013.01); *H01L 29/0646* (2013.01)

(58) Field of Classification Search
CPC .................................................. H01L 27/1211
USPC ........................................................ 257/369
See application file for complete search history.

(56) References Cited

U.S. PATENT DOCUMENTS

| 7,838,967 B2 | 11/2010 | Chen |
| 8,338,939 B2 | 12/2012 | Lin et al. |
| 2012/0309118 A1 | 12/2012 | Wang et al. |

OTHER PUBLICATIONS

Dupre, C., et al., "15nm-Diameter 3D Stacked Nanowires with Independent Gates Operation: ΦFET," IEEE International Electron Devices Meeting (IEDM) 2008, pp. 749-752.
Hubert, A., et al., "A Stacked SONOS Technology, Up to 4 Levels and 6nm Crystalline Nanowires, with Gate-All-Around or Independent Gates (Φ-Flash), Suitable for Full 3D Integration," IEEE International Electron Devices Meeting (IEDM) 2009, pp. 27.6.1-27.6.4.

*Primary Examiner* — Anthony Ho
(74) *Attorney, Agent, or Firm* — Slater Matsil, LLP

(57) ABSTRACT

Semiconductor devices and methods of manufacture thereof are disclosed. In some embodiments, a semiconductor device includes a first fin field effect transistor (FinFET) disposed over a substrate, and a second FinFET device disposed over the first FinFET. A junction isolation material is disposed between a source of the first FinFET and a source of the second FinFET.

20 Claims, 21 Drawing Sheets

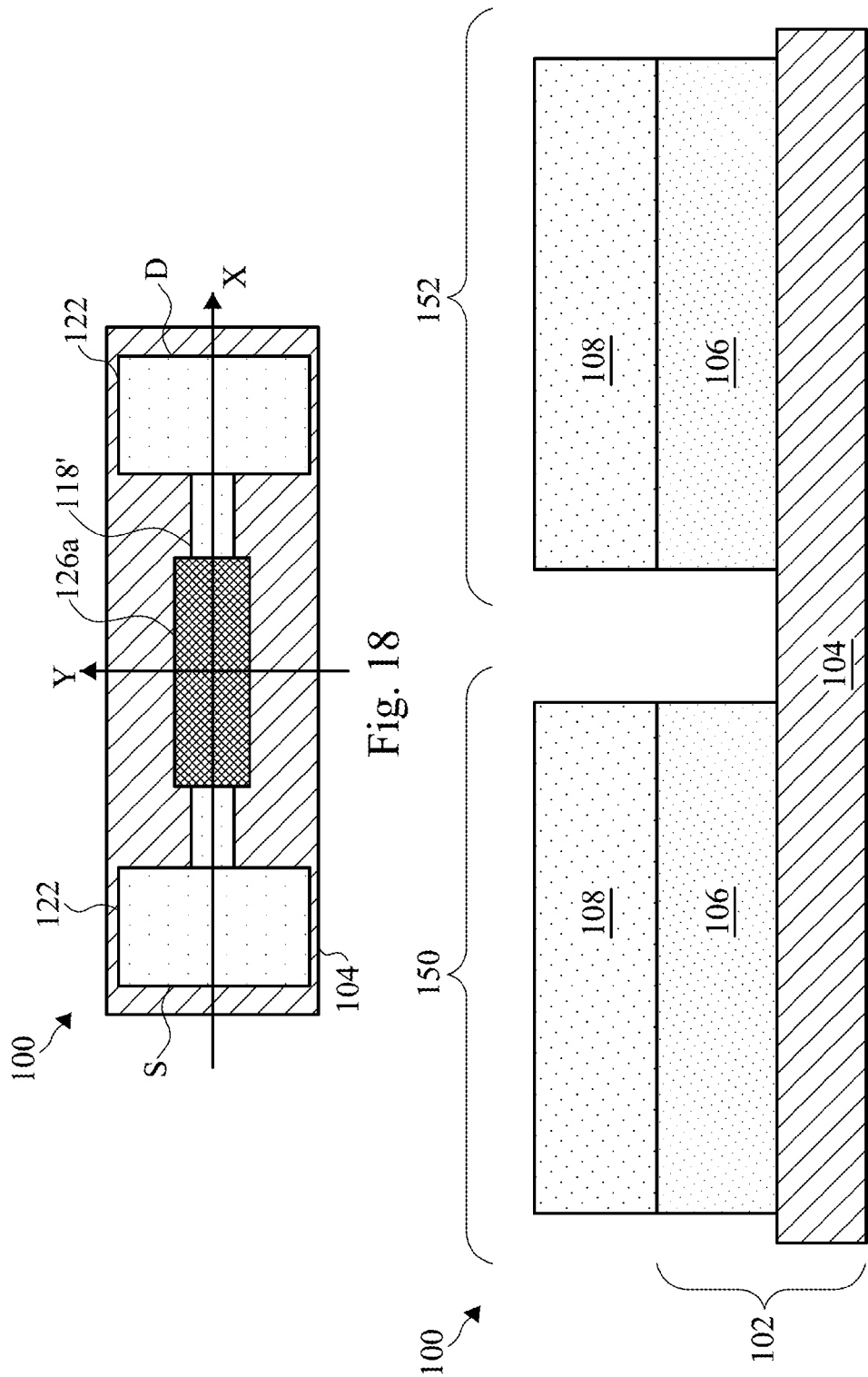

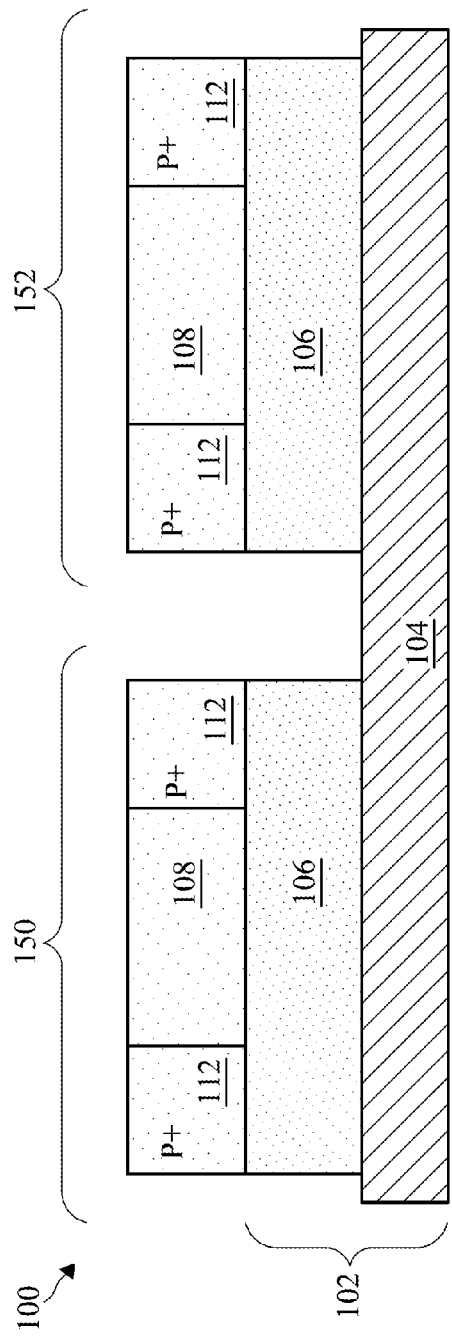
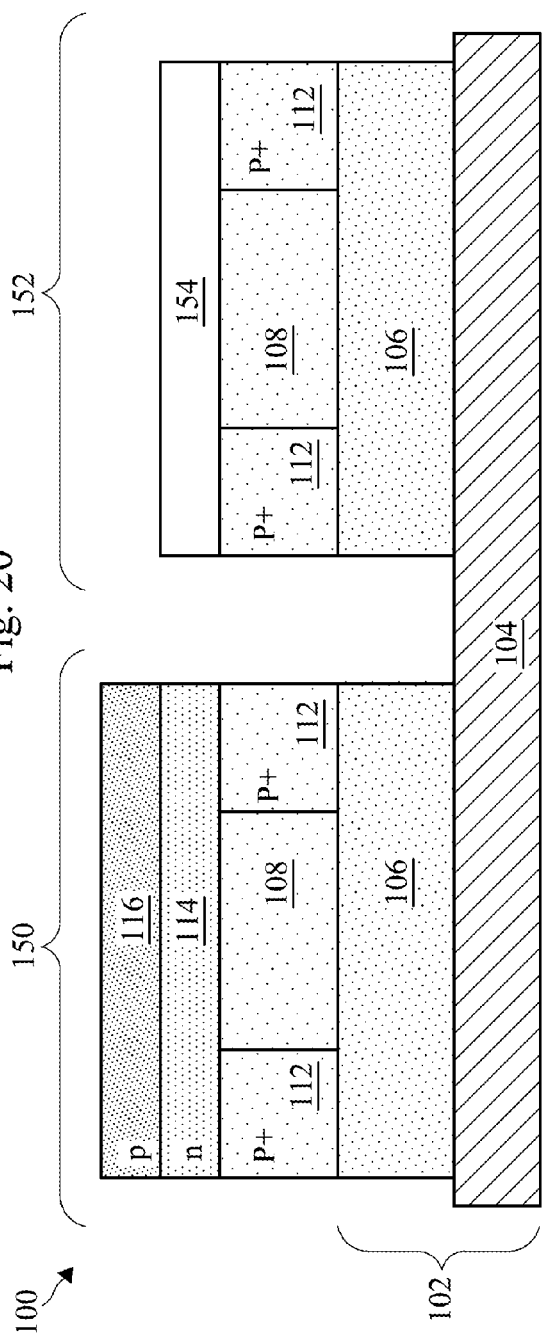

SEMICONDUCTOR DEVICES AND MANUFACTURING METHODS THEREOF

BACKGROUND

Semiconductor devices are used in a variety of electronic applications, such as computers, cell phones, digital cameras, and other electronic equipment, as examples. Semiconductor devices are typically fabricated by sequentially depositing insulating or dielectric layers, conductive layers, and semi-conductive layers of material over a semiconductor substrate, and patterning the various material layers using lithography to form circuit components and elements thereon.

A transistor is an element that is utilized extensively in semiconductor devices. There may be thousands of transistors on a single integrated circuit (IC) in some applications, for example. One common type of transistor used in semiconductor device fabrication is a metal oxide semiconductor field effect transistor (MOSFET).

Multiple gate field-effect transistors (MuGFETs) are a recent development in semiconductor technology which typically are MOSFETs that incorporate more than one gate into a single device. The multiple gates may be controlled by a single gate electrode, where the multiple gate surfaces act electrically as a single gate. The multiple gates may also be controlled by independent gate electrodes. One type of MuG-FET is referred to as a fin field effect transistor (FinFET) device, which is a transistor structure with a fin-like semiconductor channel that is raised vertically out of the silicon surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14 through 18 are cross-sectional views and a top view that illustrate a method of manufacturing a semiconductor device at various stages in accordance with some embodiments.

FIGS. 19 through 24 are cross-sectional views that illustrate a method of manufacturing a semiconductor device at various stages in accordance with some embodiments.

DETAILED DESCRIPTION

Figure 1:
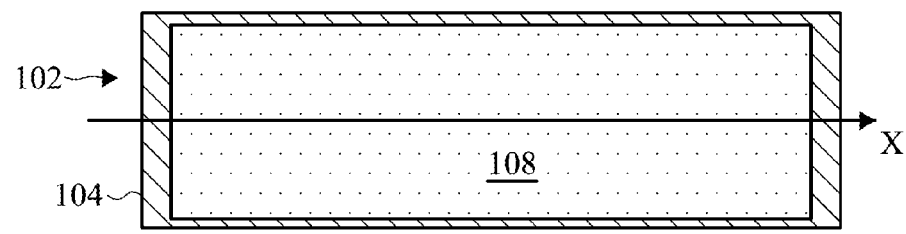
FIGS. 1 through 11 are top views and cross-sectional views that illustrate a method of manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of manufacture thereof are disclosed in the present disclosure, wherein stacked FinFETs are formed that are coupled together and comprise inverters. A junction isolation material or region between sources of the FinFETs is self-aligned. Additional stacked or non-stacked FinFETs may also be formed during the various manufacturing steps and processes for the material layers used to form the stacked FinFET inverters. The inverters comprise stacked NFETs and PFETs that may comprise single channels or multiple channels.

Some embodiments described herein are in reference to a specific context, namely forming fin field effect transistor (FinFET) devices. Aspects of this disclosure may also be applied in other contexts, such as forming other types of devices or semiconductor devices. Specific dimensions given below are for illustrative purposes for a given technology node, such as for about 15 nm technology or smaller. Other embodiments contemplate different dimensions, particularly at different technology nodes. The figures discussed below are not necessarily drawn to scale.

Figure 2:
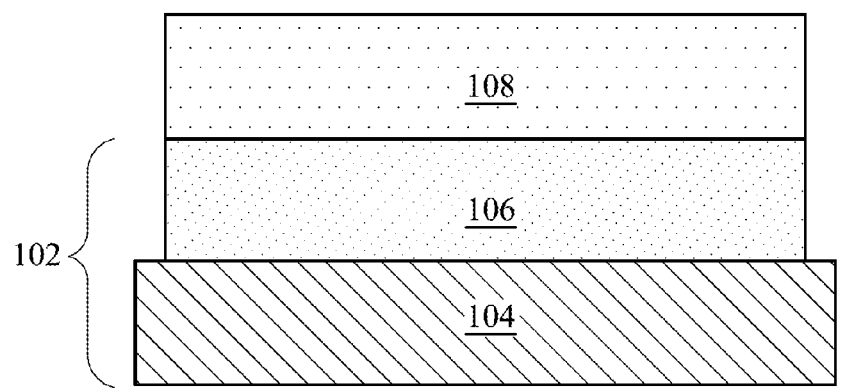
Figure 3:
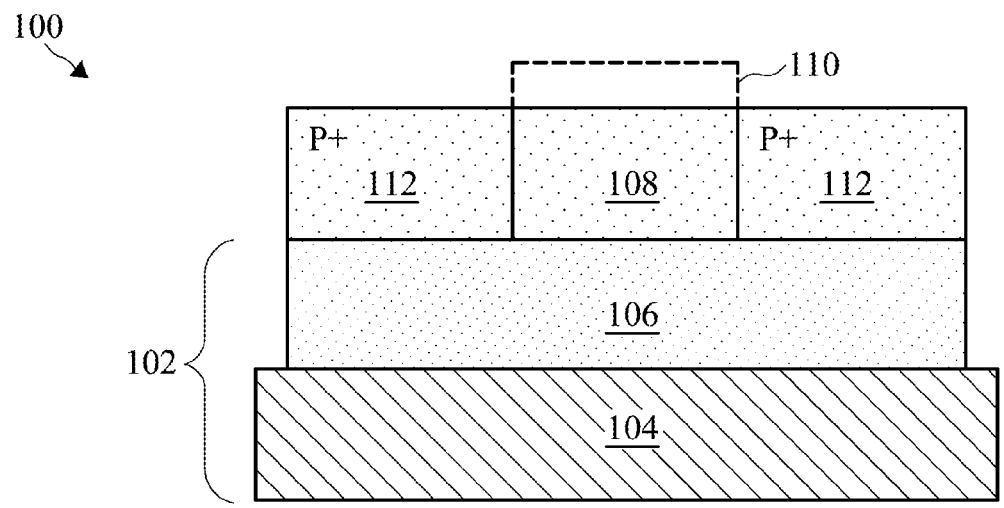
Figure 4:
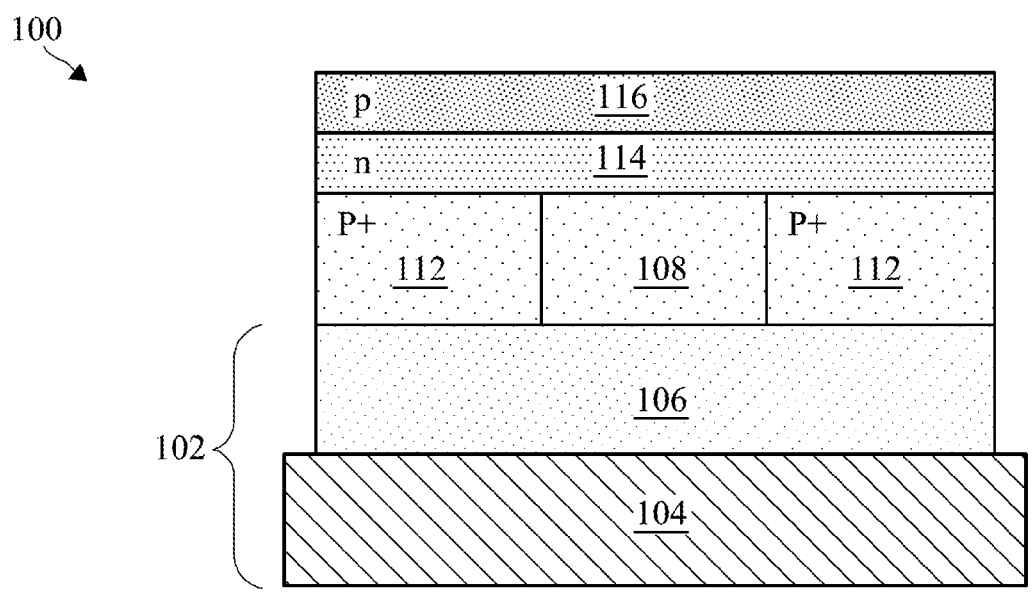
Figure 5:
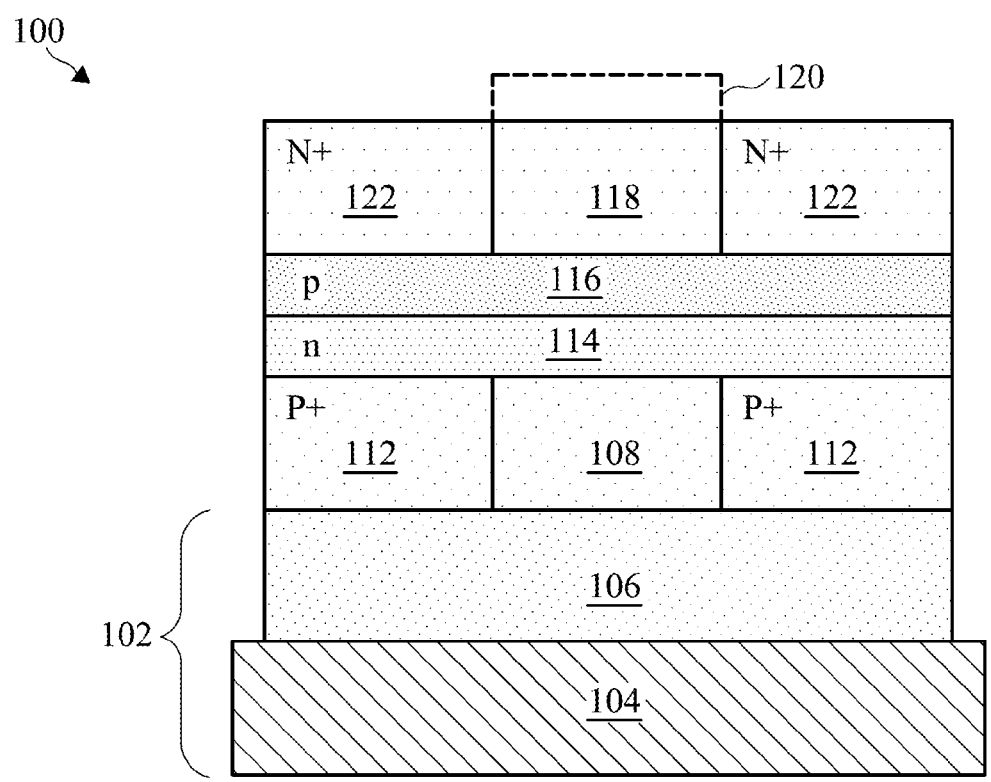
Figure 6:
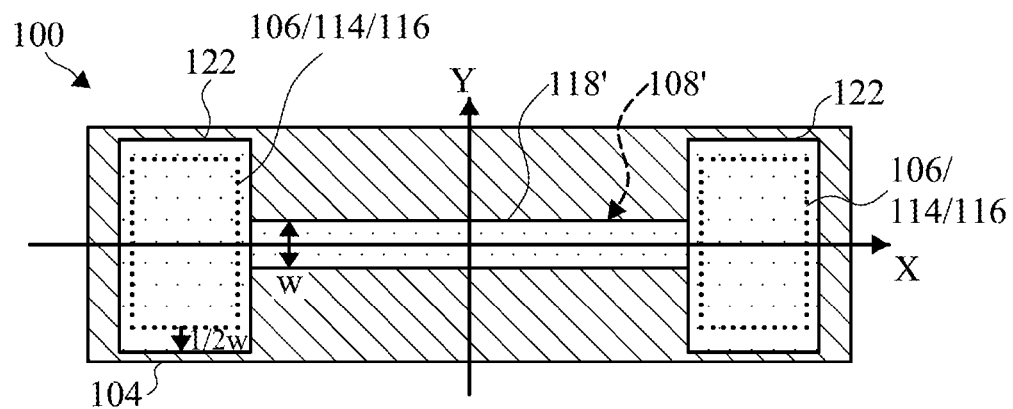
Figure 7:
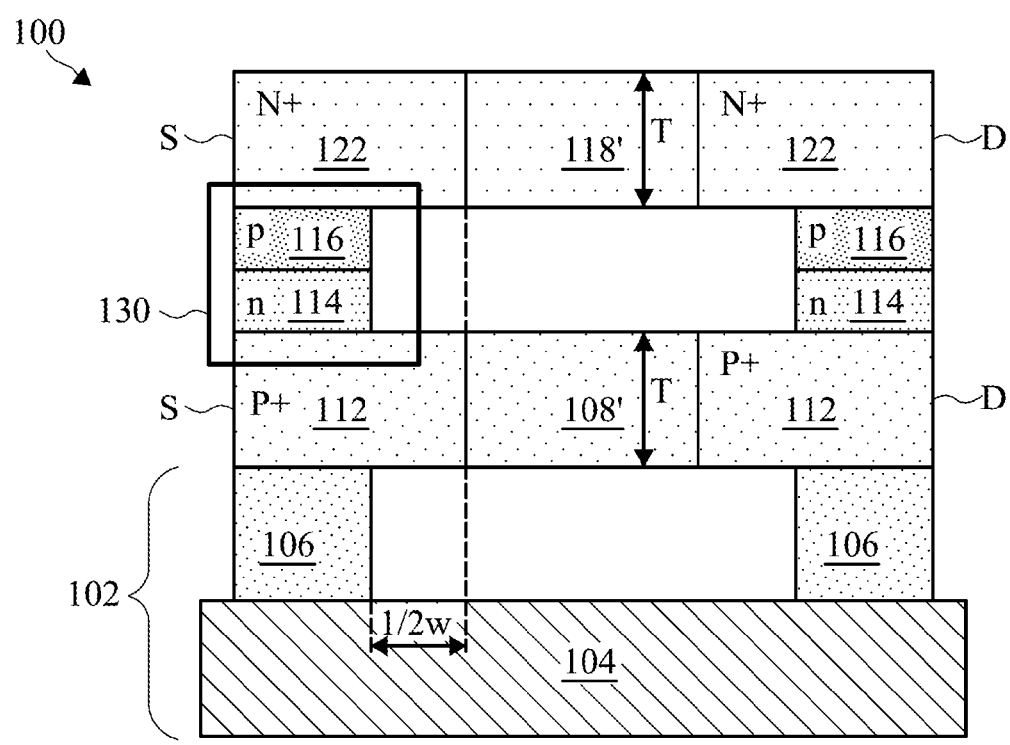
Figure 8:
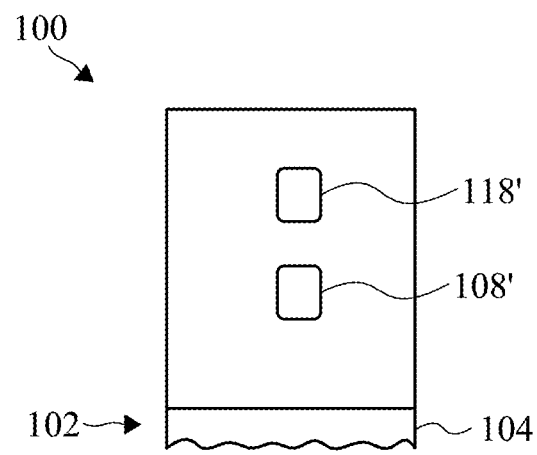
Figure 9:
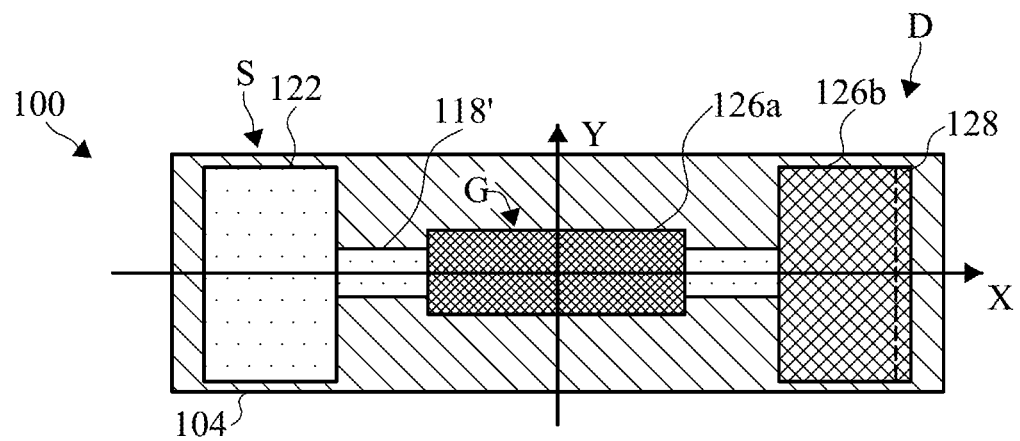
Figure 10:
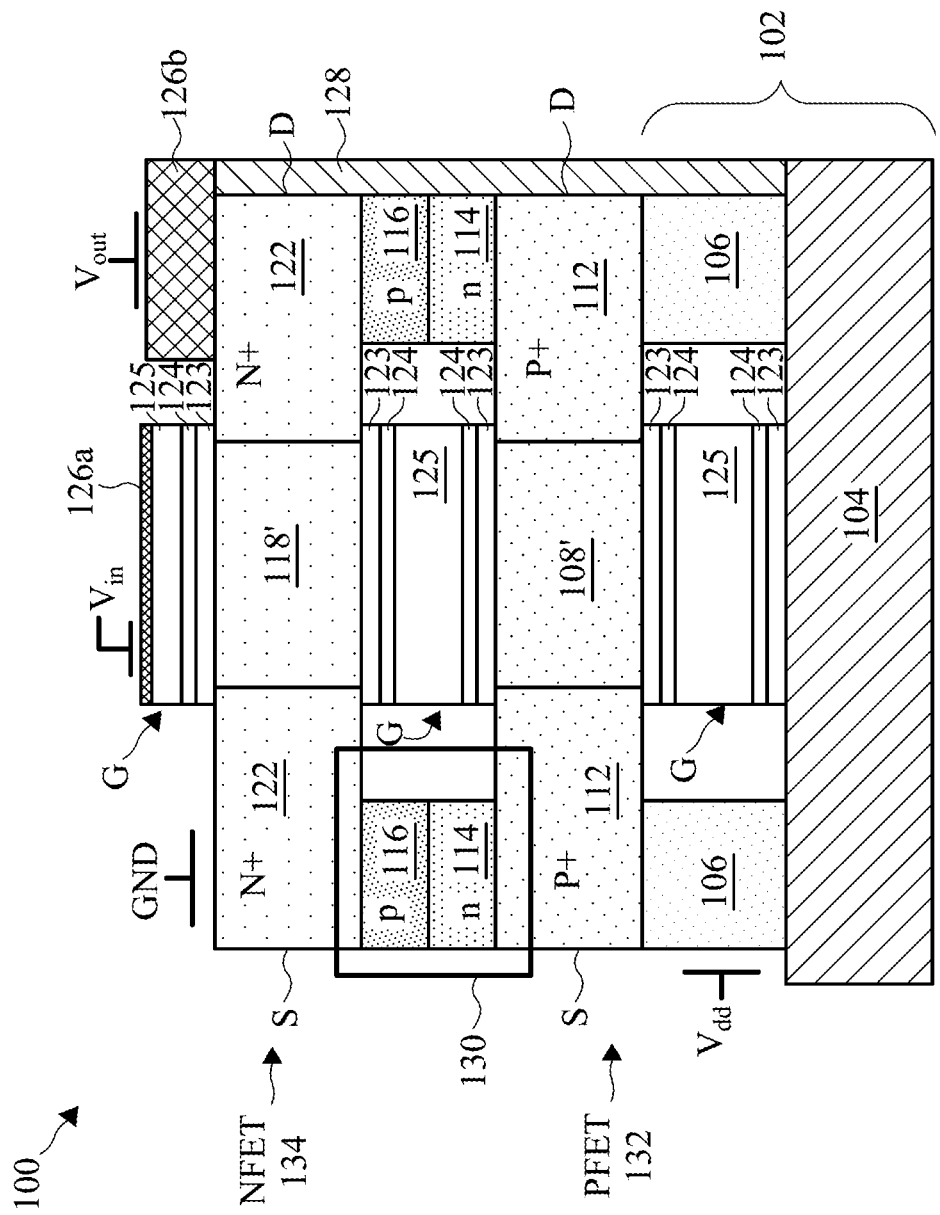
Figure 11:
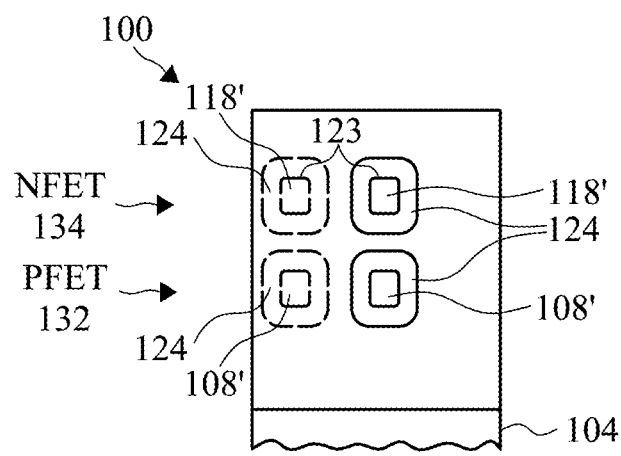

FIGS. 1 through 11 are cross-sectional views and top views that illustrate a method of manufacturing a semiconductor device 100 comprising a three-dimensional (3D) stacked FinFET device at various stages of the manufacturing process in accordance with some embodiments of the present disclosure. In the illustrated embodiments, a stacked FinFET device is formed wherein a negative channel FET (NFET) 134 comprising a FinFET is stacked over a positive channel FET (PFET) 132 comprising a FinFET (see FIG. 10). The PFET 132 materials are first formed over a substrate 102, as shown in FIGS. 1 through 3, and the NFET 134 materials are then formed over the PFET 132 materials, as shown in FIGS. 4 and 5. The PFET 132 materials and NFET 134 materials are then patterned, as shown in FIGS. 6 through 8, and processing of the semiconductor device 100 is continued as shown in FIGS. 9 through 11 to form gate dielectrics, gates, and contacts. In other embodiments, a stacked FinFET device may be formed wherein a PFET is stacked over an NFET.

In the embodiments shown in FIGS. 1 through 11, a cyclic epitaxial growth and implantation process is used. Referring first to FIG. 1, a top view of a semiconductor device 100 is shown. A cross-sectional view along an x plane of the semiconductor device 100 is shown in FIG. 2. To manufacture the semiconductor device 100 in accordance with some embodiments, a substrate 102 is provided. The substrate 102 may be part of a wafer. The substrate 102 may comprise a semiconductor substrate, such as a silicon substrate, a silicon carbon substrate, a silicon germanium substrate, or a substrate formed of other semiconductor materials, as examples. The substrate 102 may comprise a bulk substrate, a semiconductor-on-insulator (SOI) substrate, or other acceptable types of substrates. In some of the embodiments shown in FIGS. 1 and 2, the substrate 102 comprises an SOI substrate comprised of an insulating material 104 comprising an oxide such as silicon dioxide, and a layer of semiconductive material 106 comprising silicon disposed on the insulating material 104. The insulating material 104 comprises a buried oxide (BOX) in some embodiments, for example. The semiconductive material 106 may be lightly doped with a p-type impurity. In the embodiments illustrated, the semiconductive material 106 is doped with a p-type impurity, such as B, Ga, or In to a concentration of about $1\times10^{15}$ cm$^{-3}$ to about $1\times10^{16}$ cm$^{-3}$, as examples. The semiconductive material 106 may also be implanted using other materials to other concentration levels. In other embodiments, e.g., wherein a stacked FinFET device comprises a PFET stacked over an NFET, the semiconductive material 106 may be implanted with an n-type impurity. The insulating material 104 comprises a thickness of about 100 µm to about 500 µm, or about 250 µm to about 350 µm, and the semiconductive material 106 comprises a thickness of about 20 nm to about 50 nm, or about 30 nm to about 40 nm, as examples. The substrate 102 may also comprise other materials and dimensions. A portion of the semiconductor device 100 is shown in the drawings of the present disclosure; the semiconductor device 100 may initially comprise a circular or other shapes in a top view in some embodiments, for example. A plurality of PFETs, NFETs, and other devices is formed across a surface of the semiconductor device 100 in accordance with some embodiments, for example. In other embodiments, the substrate 102 does not comprise an SOI substrate, and the portion of the semiconductor device 100 illustrated in the drawings is formed over shallow trench isolation (STI) regions, BOX regions, or other isolation regions of the substrate 102, as another example.

A first semiconductive material 108 is formed over the semiconductive material 106 of the substrate 102, as illustrated in FIG. 2 in the cross-sectional view. The first semiconductive material 108 is formed using an epitaxial growth process in some embodiments, for example. The first semiconductive material 108 may be formed using metal-organic CVD (MOCVD), molecular beam epitaxy (MBE), liquid phase epitaxy (LPE), vapor phase epitaxy (VPE), selective epitaxial growth (SEG), the like, or a combination thereof. The first semiconductive material 108 comprises SiGe, Ge, or a III-V material in some embodiments, for example. In embodiments wherein the first semiconductive material 108 comprises a 111-V material, the first semiconductive material 108 may comprise InAs, AlAs, GaAs, InP, GaN, InGaAs, InAlAs, GaSb, AlSb, AlP, GaP, as examples. The first semiconductive material 108 comprises a thickness of about 3 nm to about 30 nm, or about 10 nm to about 20 nm in some embodiments, for example. The first semiconductive material 108 is in-situ doped with a desired doping level for channel regions of a PFET 132 in some embodiments, for example. The first semiconductive material 108 may also comprise other materials and dimensions, and may be formed using other methods.

An implantation process is used to implant dopants into portions of the first semiconductive material 108 to form source and drain regions 112 in the first semiconductive material 108, as shown in FIG. 3 in a cross-sectional view. A mask 110 is used in some embodiments to prevent the dopants from entering portions of the first semiconductive material 108, such as channel regions disposed between the source and drain regions 112. The mask 110 comprises a photoresist or other materials, which is deposited over the substrate 102 using a spin-on technique or other methods. The mask 110 is patterned using lithography, leaving the mask 110 shown in phantom (e.g., in dashed lines) in FIG. 3 disposed over regions of the first semiconductor material 108. The implantation process is then performed for the first semiconductive material 108, forming source and drain regions 112 of a first FinFET device. The implanted dopants comprise p-type dopants in the embodiments illustrated. The p-type impurities may comprise B, Ga, or In implanted to a concentration of about $1\times10^{20}$ cm$^{-3}$ to about $5\times10^{21}$ cm$^{-3}$, as examples. The implanted dopants may also comprise n-type dopants, e.g., in other embodiments wherein a stacked FinFET device comprises a PFET stacked over an NFET. The first semiconductive material 108 is doped in the source and drain regions 112 with a same type (i.e., n-type or p-type) of dopant that the semiconductive material 106 of the substrate 102 is doped with in some embodiments. The source and drain regions 112 may also be implanted using other materials to other concentration levels. After the implantation process, the mask 110 may be removed using an acceptable ashing process and/or an etch process. The ashing process may include an oxygen-containing plasma, for example.

The source and drain regions 112 comprise a P+ material in some embodiments, for example. The source and drain regions 112 comprise source (S) and drain (D) regions 112 of a PFET 132 (see FIG. 7), and other portions of the first semiconductive material 108 disposed between the source and drain regions 112 will be used to form channel regions of the PFET 132. The source and drain regions 112 may also comprise an N+ material, e.g., in other embodiments wherein a stacked FinFET device comprises a PFET stacked over an NFET. The first semiconductive material 108 comprises a different material than a material of the semiconductive material 106 of the substrate 102 in some embodiments, for example.

A second semiconductive material 114 is formed over the first semiconductive material 108, as shown in FIG. 4 in a cross-sectional view. The second semiconductive material 114 comprises silicon that is implanted with an n-type dopant in some embodiments. The second semiconductive material 114 may also comprise silicon that is implanted with a p-type dopant, e.g., in other embodiments wherein a stacked FinFET device comprises a PFET stacked over an NFET. The second semiconductive material 114 is doped with a different type (i.e., n-type or p-type) of dopant than source and drain regions 112 within the first semiconductive material 108 are doped with in some embodiments. The second semiconductive material 114 is epitaxially grown with in-situ doping included in the epitaxial growth process in some embodiments, for example. The second semiconductive material 114 is doped an n-type dopant such as P, As, or Sb to a concentration of about $1\times10^{15}$ cm$^{-3}$ to about $1\times10^{16}$ cm$^{-3}$, as examples. The second semiconductive material 114 comprises a thickness of about 10 nm to about 30 nm, or about 15 nm to about 25 nm. The second semiconductive material 114 may also comprise other materials, dimensions, dopants, dopant concentration levels, and formation methods. As other examples, the second semiconductive material 114 may be epitaxially grown or deposited, and an implantation process may be used to dope the second semiconductive material 114.

A third semiconductive material 116 is formed over the second semiconductive material 114, also shown in FIG. 4. The third semiconductive material 116 comprises silicon that is implanted with a p-type dopant in some embodiments. The third semiconductive material 116 may also comprise silicon that is implanted with an n-type dopant, e.g., in other embodiments wherein a stacked FinFET device comprises a PFET stacked over an NFET. The third semiconductive material 116 is doped with a different type (i.e., n-type or p-type) of dopant than the second semiconductive material 114 is doped with in some embodiments. The third semiconductive material 116 is epitaxially grown with in-situ doping included in the epitaxial growth process, for example. The third semiconductive material 116 is doped with a p-type dopant such as B, Ga, or In to a concentration of about $1 \times 10^{15}$ cm$^{-3}$ to about $1 \times 10^{16}$ cm$^{-3}$, as examples. The third semiconductive material 116 comprises a thickness of about 10 nm to about 30 nm, or about 15 nm to about 25 nm. The third semiconductive material 116 may also comprise other materials, dimensions, dopants, dopant concentration levels, and formation methods. As other examples, the third semiconductive material 116 may be epitaxially grown or deposited, and an implantation process may be used to dope the third semiconductive material 116.

The second semiconductive material 114 and the third semiconductive material 116 are later patterned to form a junction isolation material 130 (see FIG. 7) in some embodiments that is advantageously self-aligned, to be described further herein.

A fourth semiconductive material 118 is then formed over the third semiconductive material 116 using an epitaxial growth process, as illustrated in FIG. 5 in a cross-sectional view. As deposited, the fourth semiconductive material 118 comprises similar materials and dimensions as described for the first semiconductive material 108. The fourth semiconductive material 118 is in-situ doped with a desired doping level for channel regions of an NFET 134 in some embodiments, for example. A mask 120 (shown in phantom in FIG. 5) similar to the mask 110 used to implant dopants into source and drain regions 112 formed within the first semiconductive material 108 is deposited over the fourth semiconductive material 118. An implantation process is then used to implant dopants into the fourth semiconductive material 118 and form source and drain regions 122 in the fourth semiconductive material 118. The dopants implanted into the fourth semiconductive material 118 comprise a different type (i.e., p-type or n-type) than the dopants implanted into the first semiconductive material 108.

The fourth semiconductive material 118 is implanted with an n-type dopant in some embodiments to form the source and drain regions 122. The fourth semiconductive material 118 may also be implanted with a p-type dopant, e.g., in other embodiments wherein a stacked FinFET device comprises a PFET stacked over an NFET. The fourth semiconductive material 118 is doped with a different type (i.e., n-type or p-type) of dopant than the source and drain regions 112 within the first semiconductive material 108 are doped with in some embodiments. The fourth semiconductive material 118 is also doped with a different type (i.e., n-type or p-type) of dopant than the third semiconductive material 116 is doped with in some embodiments. The fourth semiconductive material 114 is doped with an n-type dopant such as P, As, or Sb to a concentration of about $1 \times 10^{20}$ cm$^{-3}$ to about $1 \times 10^{21}$ cm$^{-3}$, as examples. The fourth semiconductive material 118 may also be implanted with other dopants in other dopant concentration levels.

The source and drain regions 122 comprise an N+ material in some embodiments, for example. The source and drain regions 122 comprise source (S) and drain (D) regions 122 of an NFET 134 (see FIG. 10), and other portions of the fourth semiconductive material 118 disposed between the source and drain regions 122 will be used to form channel regions of the NFET 134. The source and drain regions 122 may also comprise a P+ material, e.g., in other embodiments wherein a stacked FinFET device comprises a PFET stacked over an NFET. After the implantation process used to dope the fourth semiconductive material 118 to form the source and drain regions 122, the mask 120 is removed using an ashing process and/or etch process.

After the implantation process used to dope the fourth semiconductive material 118 to form the source and drain regions 122, and/or after the implantation process used to dope the first semiconductive material 108 to form the source and drain regions 112, the implanted dopants are then activated, e.g., by heating the semiconductor device 100 to a predetermined temperature for a predetermined period of time.

The semiconductor device 100 is then patterned using lithography to form channel regions 108' and 118' comprised of the first semiconductive material 108 and the fourth semiconductive material 118, respectively, as illustrated in a top view in FIG. 6, a cross-sectional x plane view in FIG. 7, and a cross-sectional y plane view in FIG. 8. Portions of the first semiconductive material 108 after the patterning process comprise channel regions 108', and portions of the second semiconductive material 118 after the patterning process comprise channel regions 118'. The source and drain regions 112 and 122 are also defined during the patterning process for the channel regions 108' and 118'. The shapes of the source (S) and drain (D) regions 112 and 122 are defined in the patterning process, for example.

A masking material such as a photoresist, not shown, is deposited over the fourth semiconductive material 118, and the masking material is patterned with a desired shape of channel regions 108' and 118' and source (S) and drain (D) regions 112 and 122 of the PFET 132 and the NFET 134 (see FIG. 10), respectively. The patterning process is performed using a suitable etch process, such as a reactive ion etch (RIE), a neutral beam etch (NBE), tetramethylammonium hydroxide (TMAH), ammonium hydroxide (NH$_4$OH), a wet etchant capable of etching silicon with good etch selectivity between silicon and a material of the insulating material 104, the like, or a combination thereof, using the masking material as an etch mask. The etch process may be anisotropic or isotropic and may comprise a selective etch process, as examples. The etch process used to form the channel regions 108' and 118' and source (S) and drain (D) regions 112 and 122 of the PFET 132 and the NFET 134 may also comprise other types of etch processes and properties. The masking material is then removed using an ashing process and/or etch process.

A width of the channel regions 108' and 118' comprise a dimension W, wherein dimension W comprises about 5 nm to about 50, or about 10 nm to about 30 nm in some embodiments, as shown in the top view of FIG. 6. A thickness of the channel regions 108' and 118' comprise a dimension T (see FIG. 7), wherein dimension T comprises a thickness of the first semiconductive material 108 and the fourth semiconductive material 118. Dimension T comprises about 3 nm to about 30 nm, or about 10 nm to about 20 nm in some embodiments, for example. Dimensions W and T may also comprise other values. Channel region 108' is disposed beneath channel region 118', as illustrated in the x plane view in FIG. 7 and in the y plane view in FIG. 8. The channel regions 108' and 118' may comprise substantially square or rectangular shapes in the cross-sectional y plane view shown in FIG. 8. The channel regions 108' and 118' may also comprise substantially square or rectangular shapes with rounded corners, as a result of the etch process used to pattern the first and fourth semiconductive materials 108 and 118.

The channel regions 108' and 118' comprise single channels in the embodiments shown in FIG. 1 through 10. Either one of the channel regions 108' and 118', or both, may comprise multiple channels formed in the horizontal direction (see FIG. 11) or in the vertical direction (see FIGS. 32 and 33).

The semiconductive material 106 of the substrate 102, the second semiconductive material 114, and the third semiconductive material 116 etch at a faster rate than the first and fourth semiconductive materials 108 and 118 during the etch process in some embodiments, so that the semiconductive material 106, the second semiconductive material 114, and the third semiconductive material 116 comprise an undercut beneath and/or above the first and fourth semiconductive materials 108 and 118, as illustrated in FIGS. 6 and 7. A selective etch process may be used that forms a predetermined about of undercut beneath and above the source (S) and drain (D) regions 112 and 122. The amount of the undercut comprises about ½ of dimension W, or about ½*W in some embodiments. The amount of the undercut may also comprise other values and relative values to the width of the channel regions 108' and 118' comprising dimension W. The undercut may be formed on one or more sides of the semiconductive material 106, the second semiconductive material 114, and the third semiconductive material 116.

A gate dielectric 123 and a gate material 124/125 are formed around each of the channel regions 108' and 118', and contacts 126a that are coupled to the gates (G) 124/125 and contacts 126b that are coupled to drain (D) regions 112 and 122 of the PFET 132 and the NFET 134 are formed, as shown in FIG. 9 in a top view, in FIG. 10 in a cross-sectional x plane view, and in FIG. 11 in a cross-sectional y plane view of the semiconductor device 100. The gate dielectrics 123 and gates 124/125 comprise a gate all around (GAA) structure around the channel regions 108' and 118' in some embodiments, for example.

The gate dielectrics 123 may comprise $SiO_2$, $Al_2O_3$, $ZrO_2$, $HfO_2$, $TiO_2$, or a combination or multiple layers thereof, as examples. The gate dielectrics 123 may comprise a material having a dielectric constant of k value of greater than a dielectric constant of $SiO_2$ in some embodiments, such as greater than about 3.9. The gate dielectrics 123 may be formed by a deposition process such as ALD, PEALD, CVD, PECVD, an oxidation process, or a combination thereof, as examples. The gate dielectrics 123 may comprise a thickness of about 1 nm to about 3 nm, such as about 2 nm, as examples. The gate dielectrics 123 of the PFET 132 and NFET 134 may also comprise other materials and dimensions and may be formed using other methods.

The gates (G) 124/125 comprise a first gate material 124 and a second gate material 125 in some embodiments. The first gate material 124 may comprise TiN or TiSiN having a thickness of about 0.5 nm to about 3 nm, such as about 1 nm to about 2 nm, formed by PVD or ALD, for example. The first gate material 124 is formed around the gate dielectric 123 disposed on the channel regions 108 and 118. The second gate material 125 is formed over the first gate material 124 and may comprise TiAl, TaAl, TiAlC, TaAlC, W, Co, WAl, CoA, TiN, TaN, WSi, or a combination or multiple layers thereof, as examples. The second gate 125 material may be formed using a deposition process such as PVD or ALD. The second gate 125 material 125 comprises a metal gate (MG) filling in some embodiments, for example. The overall width and thickness of the gates (G) 124/125 may vary as a function of the height and length of the channel regions 108' and 118' and overall semiconductor device 100, for example. The gates (G) 124/125 of the PFET 132 and NFET 134 may also comprise other materials and dimensions and may be formed using other methods.

Note that the gate dielectric 123 shown in FIG. 10 is not shown in other drawings of the present disclosure, in order to simplify the drawings, such as in FIGS. 13, 16, 17, 24, 26, and 32, as examples. However, the gate dielectric 123 is also disposed around the channel regions 108' and 118' of the FinFETs 132 and 134 beneath the gate 124/125 material in the embodiments shown in FIGS. 13, 16, 17, 24, 26, and 32.

The gate dielectric 123 material and the gate (G) 124/125 materials are formed or deposited, and are then patterned using photolithography, by depositing a photoresist (not shown), patterning the photoresist, and using an etch process to pattern the gate dielectric 123 material and the gate (G) 124/125 material using the photoresist as an etch mask, leaving the gate dielectrics 123 material and the gates (G) 124/125 disposed around the channel regions 108' and 118' in desired locations. The photoresist is then removed. The contacts 126a and 126b are then formed by depositing a contact material such as W, $WSi_x$, Al, $AlSi_x$, Cu, or a combination or multiple layers thereof, having a thickness of about 5 nm to about 50 nm, such as about 15 nm to 40 nm, and patterning the contact material using photolithography. The contacts 126a and 126b may comprise a diameter or width in a top view of about 3 nm to about 15 nm, or other dimensions, as examples. A side contact 128 may be formed in the photolithography process that makes electrical connection to the drain (D) regions 112 and 122 of the PFET 132 and NFET 134, respectively, in some embodiments. In some embodiments, a single photolithography process may be used to pattern and form the contacts 126a, 126b, side contacts 128, gates 124/125, and gate dielectrics 123, for example.

The PFET 132 is also referred to herein, e.g., in some of the claims, as a first FinFET 132, and the NFET 134 is also referred to as a second FinFET 134.

FIG. 10 also illustrates electrical connections of the PFET 132 and NFET 134 in some embodiments wherein the PFET 132 and NFET 134 are coupled together and utilized as an inverter. Gates (G) 124/125 of the PFET 132 and NFET 134 are coupled together by the second gate material 125, and drains (D) 112 and 122 of the PFET 132 and NFET 134 are coupled together by a side contact 128 or other types of contacts. Coupling of the gates (G) 124 and the drains (D) 112 and 122 of the first and second FinFETs 132 and 134 forms an inverter in some embodiments.

The semiconductor device 100 shown in FIG. 10 comprises a 3D stacked FinFET complementary metal oxide semiconductor (CMOS) inverter in some embodiments, for example. A junction isolation material or region 130 of the semiconductor device 100 is advantageously self-aligned due to the structure and manufacturing method. The second semiconductive material 114 comprising the n-type material and the third semiconductive material 116 comprising the p-type material are patterned in the same patterning process used to form the PFET 132 and NFET 134 sources (S) 112 and 122, drains (D) 112 and 122, and channel regions 108' and 118', and thus, the junction isolation material or region 130 is self-aligned to the PFET 132 and the NFET 134, for example.

To electrically connect the inverter to a device outside the semiconductor device 100 or to another device disposed on the semiconductor device 100, as examples, a source (S) 112 of the PFET 132 is coupled to a voltage supply (Vdd) contact via a portion of the semiconductive material 106 of the substrate 102. The source (S) 122 of the NFET 134 is coupled to a ground (GND) contact. The gates (G) 124/125 of the PFET 132 and NFET 134 are coupled to a voltage input (Vin) contact. The drains (D) 112 and 122 of the PFET 132 and the NFET 134, respectively, are coupled to a voltage output (Vout) contact. The ground (GND) contact and the voltage supply (Vdd) contact are not shown in FIG. 10; see the embodiments shown in FIG. 13, which will be described further herein.

The cross-sectional y plane view of the semiconductor device 100 shown in FIG. 11 also illustrates that the channel regions 108' and/or 118' of the PFET 132 and the NFET 134 may comprise multiple channels 108' and 118', respectively. The first semiconductive material 108 and/or the fourth semiconductive material 118 may be patterned to include two or more channels 108' and/or 118' in a horizontal direction, as shown in the cross-sectional view in phantom.

Figure 12:
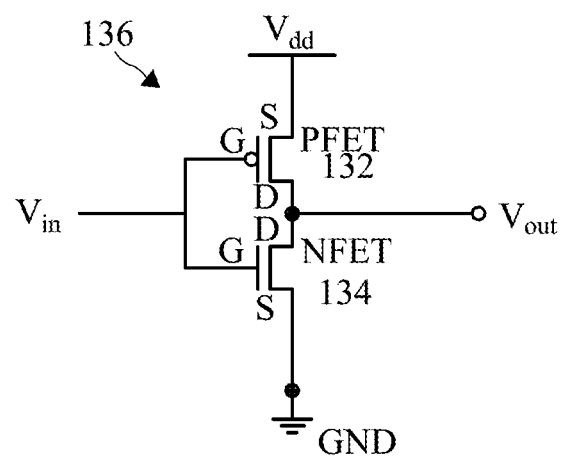
FIG. 12 is a schematic of a semiconductor device in accordance with some embodiments.

FIG. 12 is a schematic 136 of a semiconductor device 100 in accordance with some embodiments. The semiconductor device 100 comprises an inverter that includes a PFET 132 FinFET and an NFET 134 FinFET, as illustrated in FIGS. 9, 10, and 11. Electrical connections shown and described with reference to the cross-sectional view of the semiconductor device 100 shown in FIG. 10 are illustrated in the schematic 136. The schematic 136 of the semiconductor device 100 may also comprise other configurations.

Figure 13:
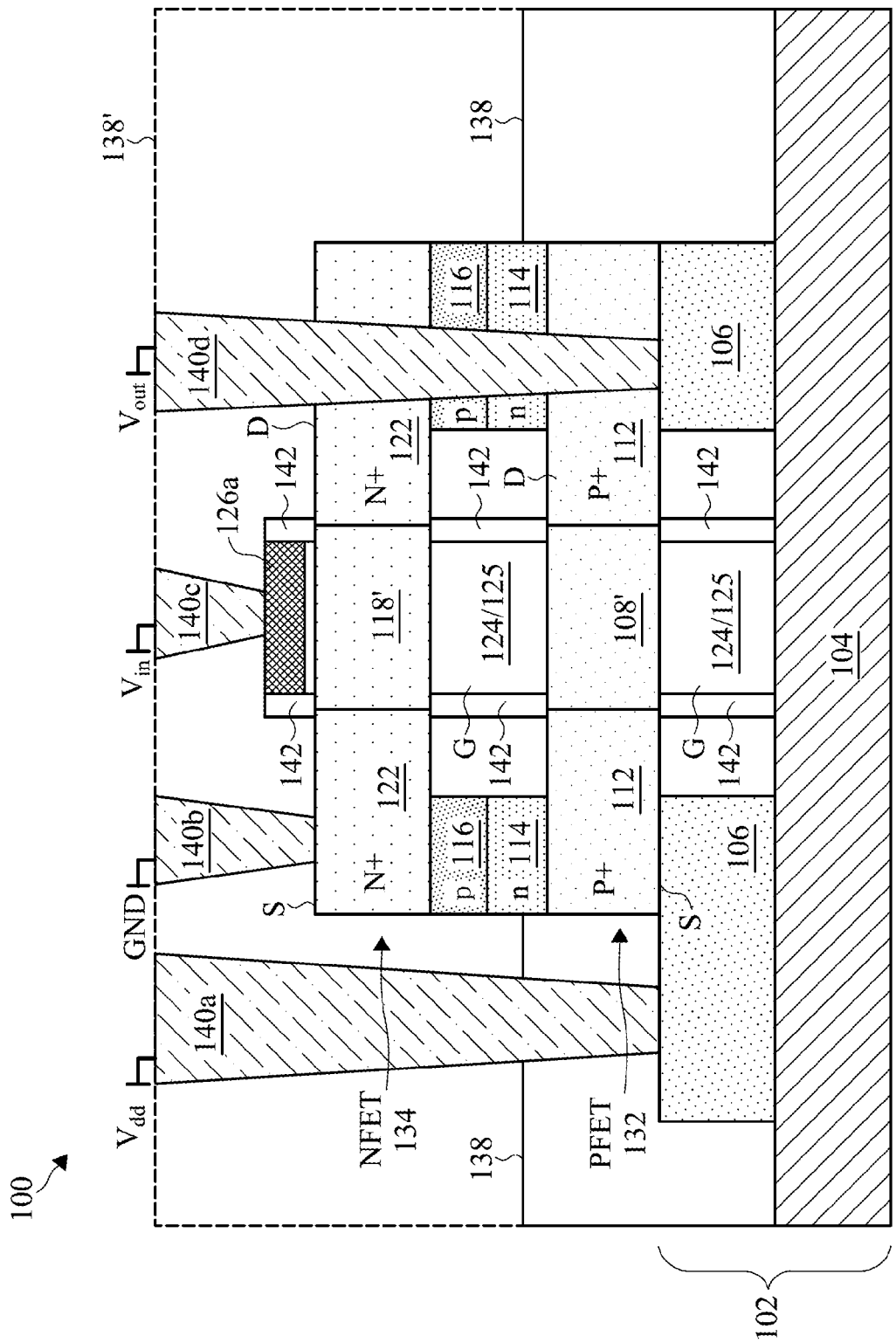
FIG. 13 shows a cross-sectional view of a semiconductor device in accordance with some embodiments.

FIG. 13 is a cross-sectional view of a semiconductor device 100 in accordance with some embodiments. Additional elements of a semiconductor device 100 in accordance with some embodiments are illustrated in FIG. 13. Insulating material 138 comprises an isolation oxide which is disposed over the substrate 102 before or after the formation of the FinFETs 132 and 134. The insulating material 138 may comprise $SiO_2$, SiON, or other oxide materials having a thickness of about 20 nm to 100 nm, such as about 40 nm to about 60 nm. The insulating material 138 may also comprise other materials and dimensions. The insulating material 138 may be deposited over the substrate 102 before the first semiconductive material 108 is formed, and the insulating material 138 may be patterned using lithography. The first semiconductive material 108 is then epitaxially grown through the patterned insulating material 138, for example. The insulating material 138 may also be deposited after the FinFETs 132 and 134 are formed.

Additional insulating material(s) 138' may be formed over insulating material 138, also shown in FIG. 13 in phantom. The insulating material(s) 138' may comprise one or more inter-layer dielectric (ILD) materials in some embodiments, for example, and may comprise similar materials and dimensions as described for insulating material 138. Contacts 140a, 140b, 140c, and 140d are formed within the insulating materials 138' and 138 using a damascene process, by patterning the insulating materials 138' and 138 with a desired pattern for the contacts 140a, 140b, 140c, and 140d, and filling the patterned insulating materials 138' and 138 with a conductive material. Excess portions of the conductive material are then removed from over the insulating material 138' using a CMP process and/or etch process. The contacts 140a, 140b, 140c, and 140d may comprise a similar material as described for contacts 126a and 126b, such as W, $WSi_x$, Al, $AlSi_x$, Cu, or a combination or multiple layers thereof, having a diameter in a top view of about 3 nm to about 15 nm, or other dimensions, as examples. Additional metallization layers that include conductive lines, vias, and underball metallization (UBM) layers may be subsequently formed over the insulating material 138', not shown.

The contacts 140a, 140b, 140c, and 140d make electrical connections to various portions of the semiconductor device 100 comprising a stacked FinFET inverter. Contact 140a comprises a voltage supply (Vdd) contact and is coupled to the source (S) 112 of the PFET 132 by a portion of the semiconductive material 106 of the substrate. Contact 140b comprises a ground (GND) contact and is coupled to the source (S) 122 of the NFET 134. Contact 140c comprises a voltage input (Vin) contact and is coupled to a contact 126a coupled to the gates (G) 124/125 of the PFET 132 and the NFET 134. Contact 140d is coupled to the drains (D) 112 and 122 of the PFET 132 and the NFET 134, and illustrates another method of making electrical connection to the drains (D) 112 and 122 other than the side contact 128 shown in FIG. 10. The contacts 140a, 140b, 140c, and 140d comprise plug contacts that are formed in subsequently deposited insulating material 138' and other material layers of the semiconductor device 100.

FIG. 13 also illustrates a sidewall spacer 142 that is disposed on sidewalls of the gates (G) 124/125 in accordance with some embodiments. The sidewall spacer 142 is formed after the gates (G) 124/125 are formed in some embodiments, by depositing the sidewall spacer 142 material, and anisotropically etching the material using a dry RIE process or other etch process, leaving the sidewall spacers 142 on sidewalls of the gates (G) 124/125. The sidewall spacers 142 may comprise $SiO_2$, $Si_3N_4$, or SiCN having a thickness of about 1 nm to about 10 nm, or about 3 nm to about 7 nm, for example. The sidewall spacers 142 may also comprise other materials, dimensions, and formation methods. The sidewall spacers 142 may prevent shorting of the gates (G) 124/125 to the sources and drains 112 and 122, for example. The sidewall spacers 142 may also be included in the other embodiments described herein, although the sidewall spacers 142 are not shown in the other figures.

In FIGS. 1 through 11, a method of forming a 3D stacked FinFET CMOS inverter using multiple cyclic epitaxial growth and implantation processes is illustrated in accordance with some embodiments. In other embodiments, implantation of the various dopant materials may be made after the epitaxial layers are formed.

Figure 14:
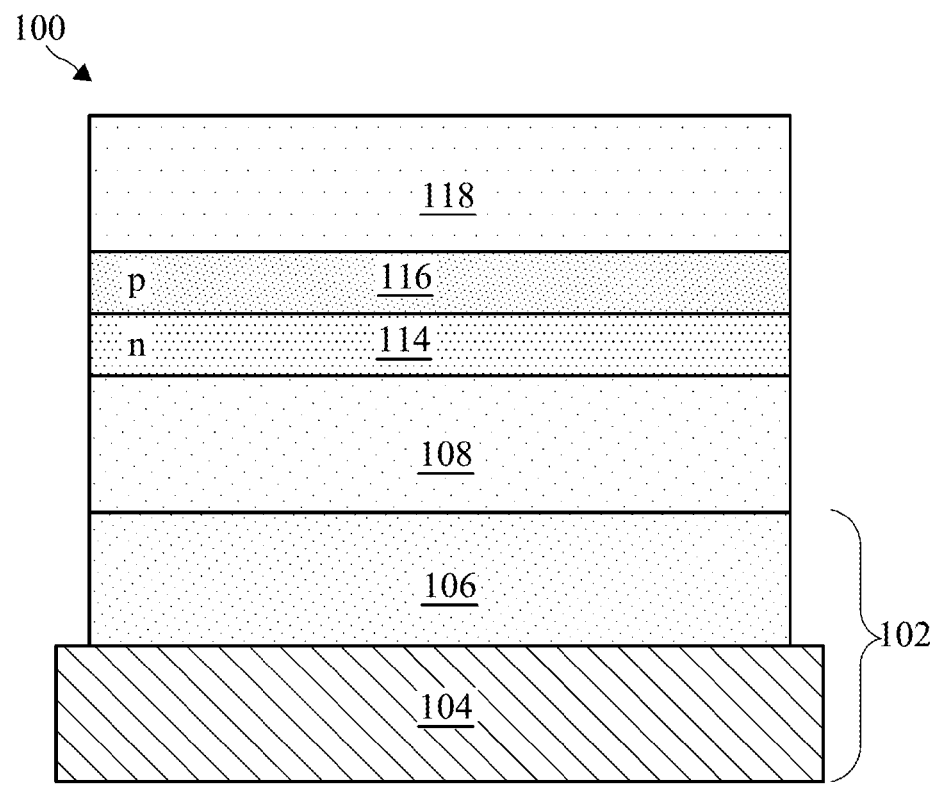
Figure 15:
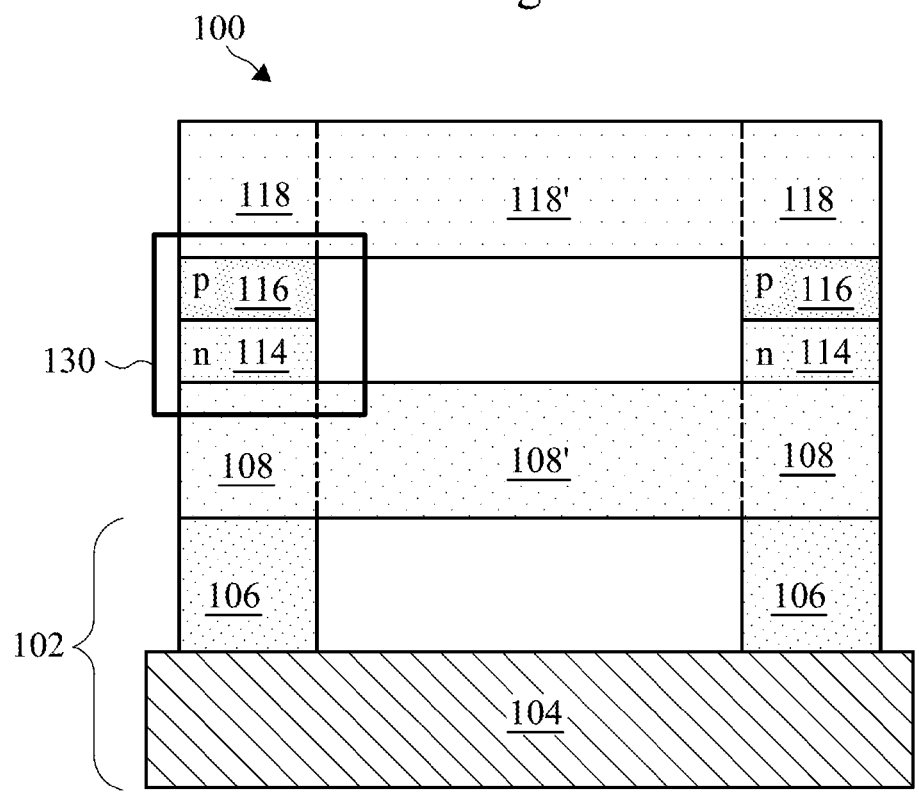
Figure 16:
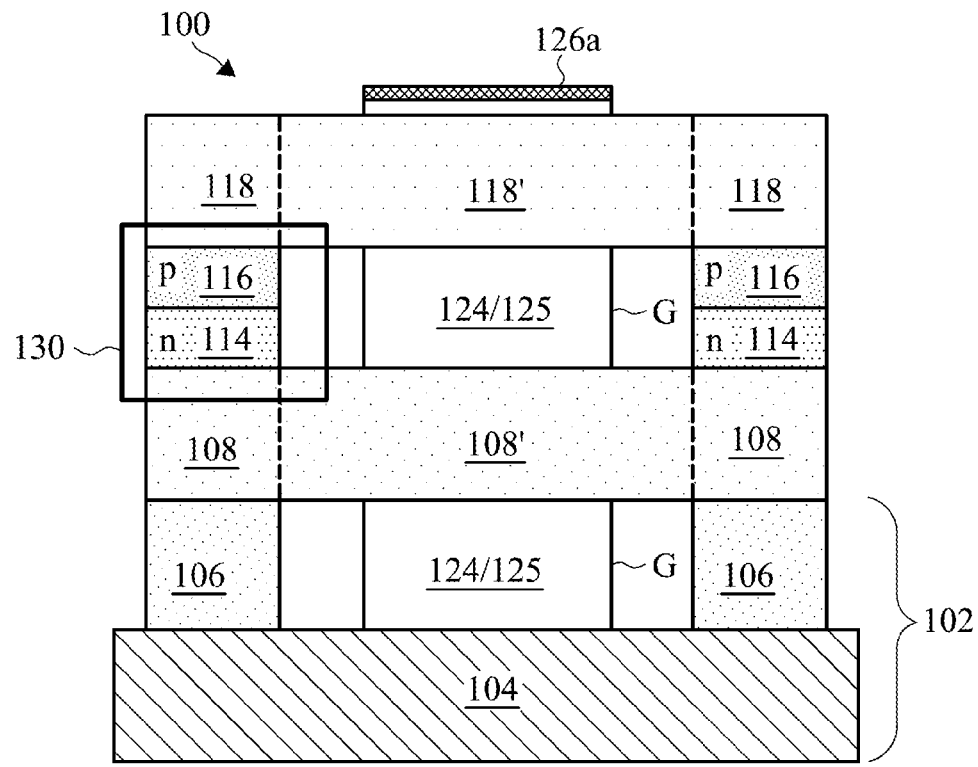
Figure 17:
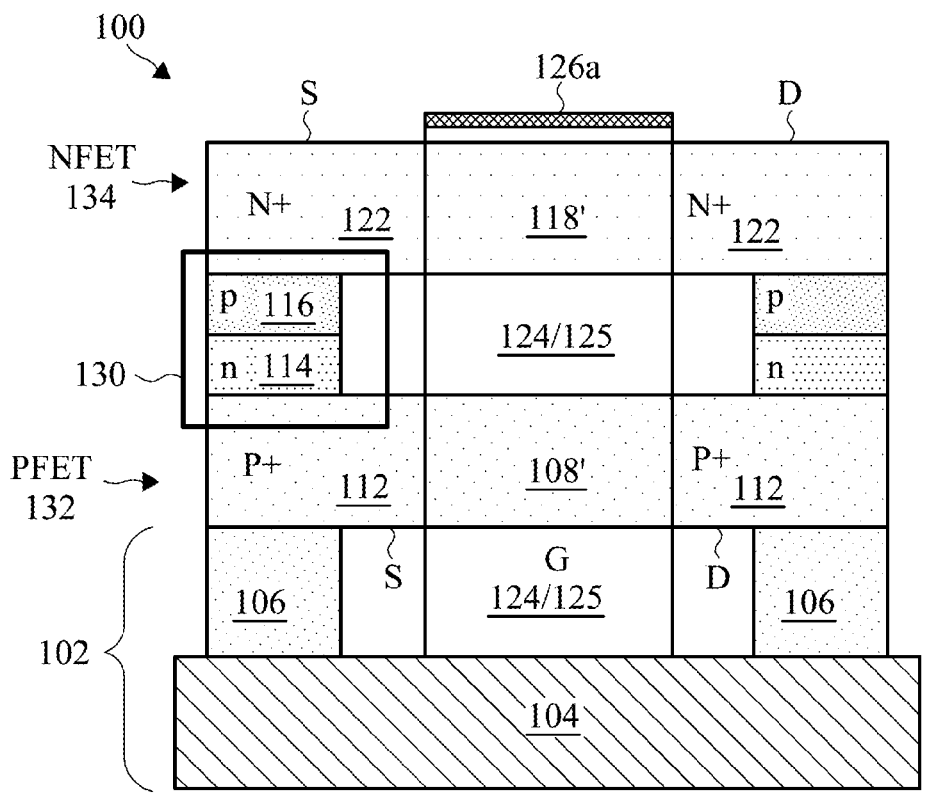

For example, FIGS. 14 through 18 are top views and cross-sectional views of a method of manufacturing a semiconductor device 100 at various stages in accordance with some embodiments, wherein the epitaxially grown semiconductive material layers 108, 114, 116, and 118 described for FIGS. 1 through 11 are implanted with dopants after their formation. In FIG. 14, the first semiconductive material 108 is formed over the substrate 102 using an epitaxial growth process, the second semiconductive material 114 is epitaxially grown over the first semiconductive material 108, the third semiconductive material 114 is epitaxially grown over the second semiconductive material 108, and the fourth semiconductive material 114 is epitaxially grown over the third semiconductive material 108. The growth processes are similar to the growth processes shown and described for FIGS. 1 through 5. In FIG. 15, an etch process is used to pattern the first and fourth semiconductive materials 108 and 118, forming the desired shapes of the source and drain regions and the channel regions 108' and 118'. The etch process is similar to the etch process described for FIGS. 6 through 8. The source and drain regions may also be undercut, as described for the previous embodiments, not shown. The gate dielectrics (not shown), gates (G) 124/125, and gate contacts 126a are formed, as shown in FIG. 16, and as described for the previous embodiments herein. Two implantation processes are then performed to implant P+ for the PMOS FinFET 132 and implant N+ for the NMOS FinFET 134 into the first and fourth semiconductive materials 108 and 118, respectively, forming the source (S) and drain (D) regions 112 and 122, respectively, of the PMOS FinFET 132 and the NMOS FinFET 134, respectively, as illustrated in FIG. 17. The implantation process is controlled to a predetermined depth within a top surface of the semiconductor device 100 to implant the dopants into the desired material layer, for example. A top view of the semiconductor device 100 shown in FIG. 17 is illustrated in FIG. 18. The dopants implanted are then activated, e.g., by heating the semiconductor device 100 to a predetermined temperature for a predetermined period of time.

The manufacturing methods for semiconductor devices 100 described herein may advantageously be integrated with fabrication of other devices on the same semiconductor device 100 in accordance with some embodiments. Other stacked or non-stacked devices, FETs, and/or FinFETs may be manufactured simultaneously with the fabrication of the FinFET inverters described herein, for example.

For example, FIGS. 19 through 24 are cross-sectional views of a method of manufacturing a semiconductor device 100 at various stages in accordance with some embodiments, wherein a non-stacked FinFET 132' is simultaneously formed when portions of a 3D stacked FinFET inverter described herein is formed. In FIG. 19, regions 150 and 152 are defined on the substrate 102, e.g., by patterning the semiconductive material 106 of the substrate 102 using lithography. The insulating material 104 disposed between regions 150 and 152 provides isolation between the two regions 150 and 152. Region 150 comprises a stacked region where a 3D stacked FinFET inverter will be formed, and region 152 comprises a non-stacked region of the substrate 102 where a non-stacked FinFET will be formed.

A first semiconductive material 108 is epitaxially grown over the semiconductive material 106 in the stacked region 150, as described for FIG. 2 and as shown in FIG. 19. The first semiconductive material 108 is also epitaxially grown simultaneously in the non-stacked region 152. A mask (not shown in FIG. 19; see mask 110 shown in phantom in FIG. 3) is formed to define channel regions, and source and drain regions 112 are formed in the first semiconductive material 108 by implanting dopants, as described for FIG. 3 and as shown in FIG. 20. The mask is then removed. The source and drain regions 112 comprise P+ regions. The source and drain regions 112 are formed in both the stacked region 150 and the non-stacked region 152. Portions of a non-stacked PFET comprising a FinFET are formed in the non-stacked region 152. Note that as in the other embodiments of the present disclosure, an NFET may first be formed by implanting N+ regions into the first semiconductive material 108, followed by the later formation of a PFET by implanting P+ regions into the fourth semiconductive material 118.

Figure 22:
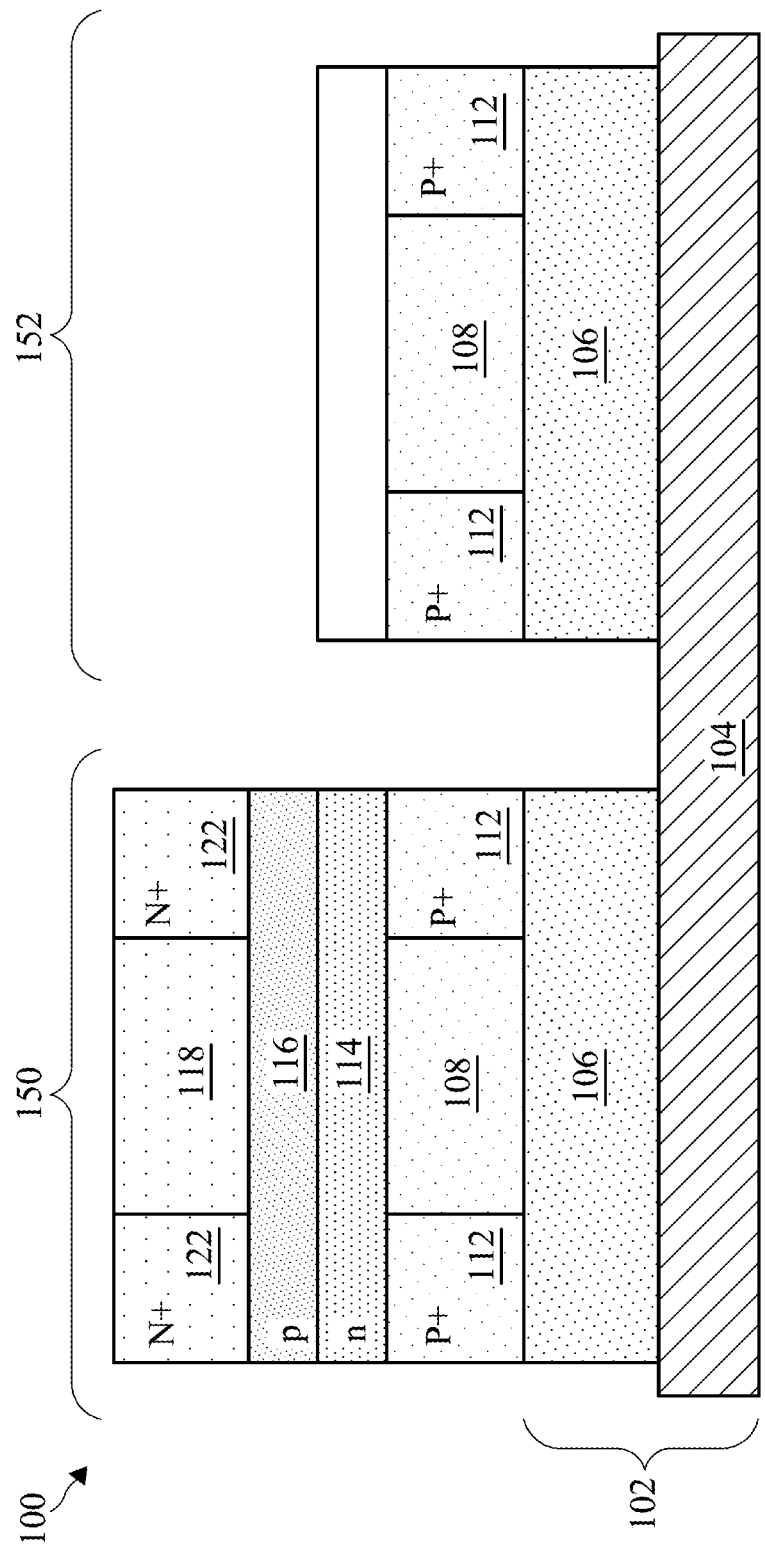

Another mask 154 is formed on the semiconductor device 100, as shown in FIG. 21. The mask 154 is patterned using lithography to remove the mask 154 from the stacked region 150. The mask 154 comprises a hard mask in some embodiments. The hard mask 154 may comprise a SiO$_2$/Si$_3$N$_4$/SiCN material stack or other materials. Processing of the stacked region 150 is then continued, such as forming the second and third semiconductive materials 114 and 116 sequentially over the first semiconductive material 108, as shown in FIG. 21, and forming the fourth semiconductive material 118 over the third semiconductive material 116 and implanting the third semiconductive material 116 with dopants to form source and drain regions 122, as shown in FIG. 22. Because an epitaxial growth process is used to form the second semiconductive material 114, the third semiconductive material 116, and the fourth semiconductive material 118, the second semiconductive material 114, the third semiconductive material 116, and the fourth semiconductive material 118 are not formed over the hard mask 154 in the non-stacked region 152.

Figure 23:
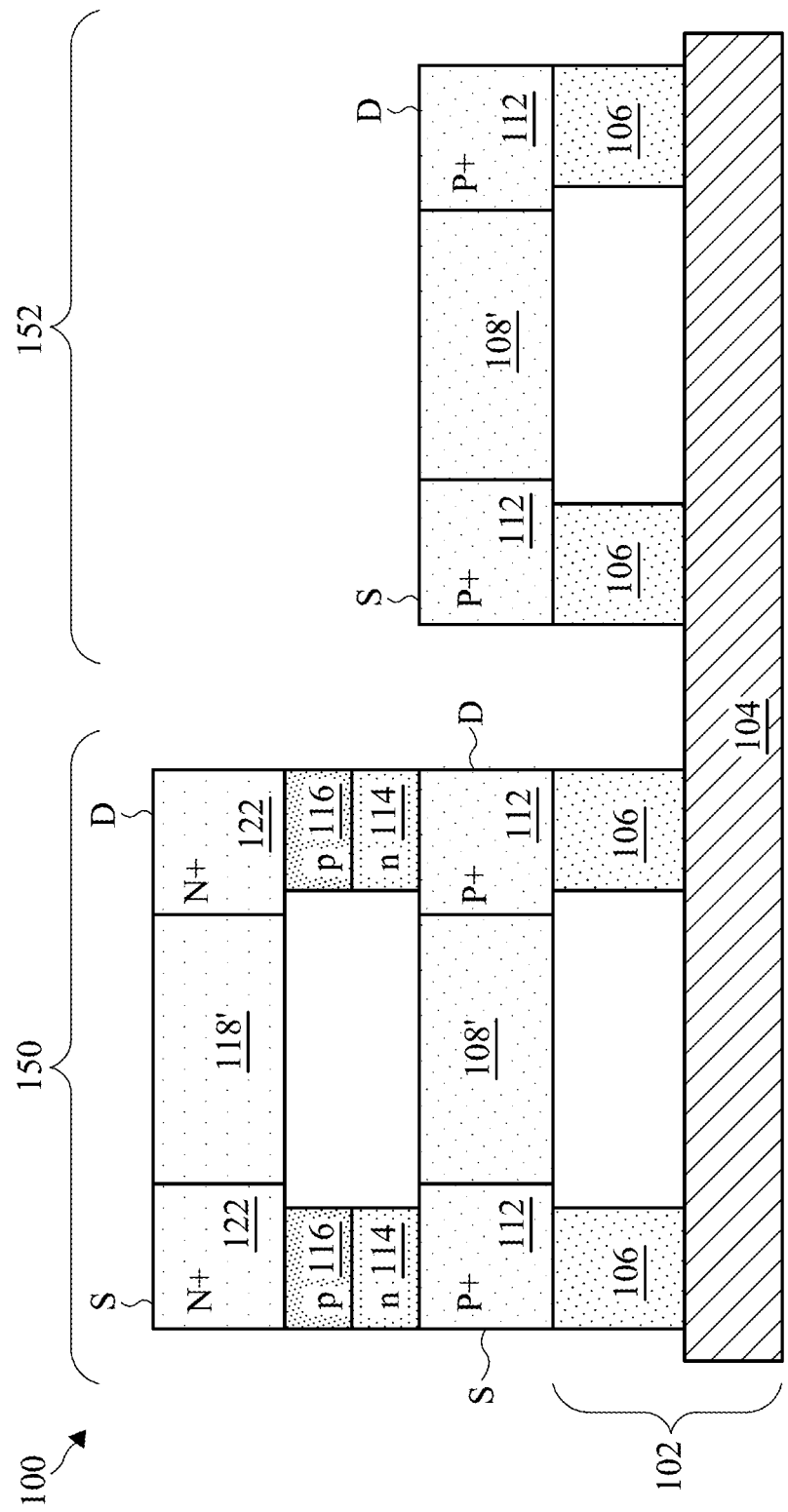
Figure 24:
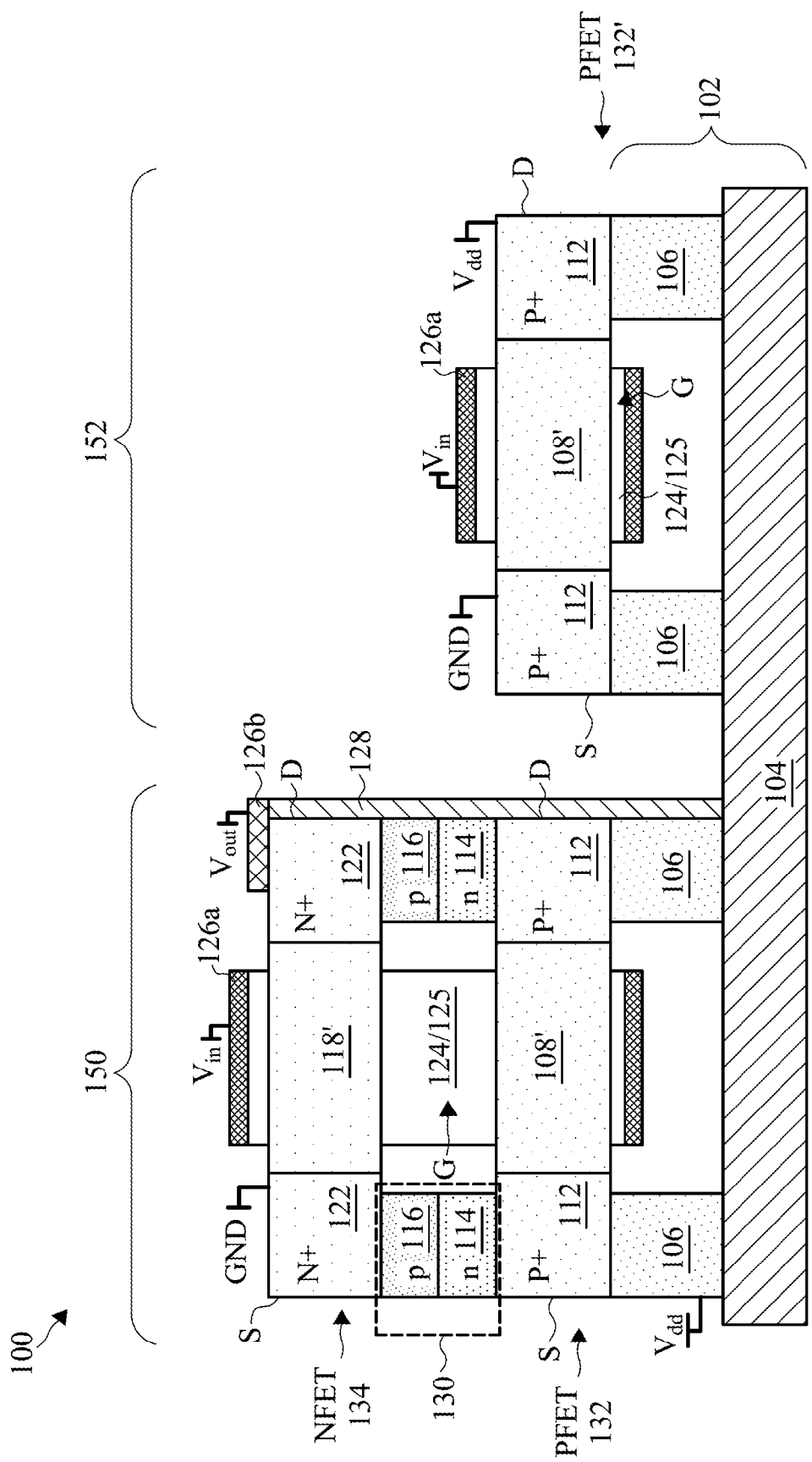

The mask 154 over the non-stacked region 152 is then removed, as shown in FIG. 23, and a patterning process and etch process are used to form the channels 108' and 118' in the stacked region 150 and form channels 108' in the non-stacked region 152. Portions of the semiconductive material 106 of the substrate 102 are undercut in the non-stacked region 152 beneath the first semiconductive material 108 from which the source (S) and drain (D) regions 112 and channel 108' is formed. A gate dielectric (not shown; see gate dielectric 123 shown in FIG. 10) and gate (G) 124/125 material is formed and patterned, as shown in FIG. 24. A contact 126a is coupled to the gate (G) 124/125 of the PFET 132' in the non-stacked region 152. The source (S) 112 of the non-stacked PFET 132' is coupleable to ground by a ground (GND) contact, the contact 126a coupled to the gate (G) 124/125 of the non-stacked PFET 132' is coupleable to a voltage input (Vin) contact, and the drain (D) 112 of the non-stacked PFET 132' is coupleable to a voltage supply (Vdd) contacts in some embodiments, for example. Other types of electrical connections may also be made to the non-stacked PFET 132' in the non-stacked region 152.

Advantageously, the non-stacked PFET 132' in the non-stacked region 152 is manufactured simultaneously with manufacturing process steps and material layers used to form the stacked NFET 134 and PFET 132 in the stacked region 150. An NFET 134 may also be formed in a non-stacked region 152 simultaneously with the formation of the stacked NFET 134 and PFET 132 in the stacked region 150. For example, before the first semiconductive material 108 is formed over the semiconductive material 106 of the substrate 102 as shown in FIG. 19, a mask comprising a hard mask or a photoresist may be formed on the non-stacked region 152. The first semiconductive material 108 is formed epitaxially and implanted with dopants as shown in FIGS. 19 and 20 in the stacked region 150, and the second semiconductive material 114 and third semiconductive material 116 are formed epitaxially in the stacked regions 150. The mask is then removed from the non-stacked region 152. Because the mask is present in the non-stacked region 152, the first semiconductive material 108, second semiconductive material 114, and third semiconductive material 116 formed by epitaxial growth are not formed in the non-stacked region 152. The fourth semiconductive material 118 is then deposited and implanted to form source and drain regions of an NFET in the non-stacked region 152 and of the NFET 134 in the stacked region 150. Thus, a non-stacked NFET may be formed simultaneously with forming the NFET 134 of the inverter in the stacked region 150. A non-stacked PFET 132' or NFET may also be formed simultaneously with the formation of the PFET 132 and/or NFET 134 in the stacked region 150 using other methods.

Figure 25:
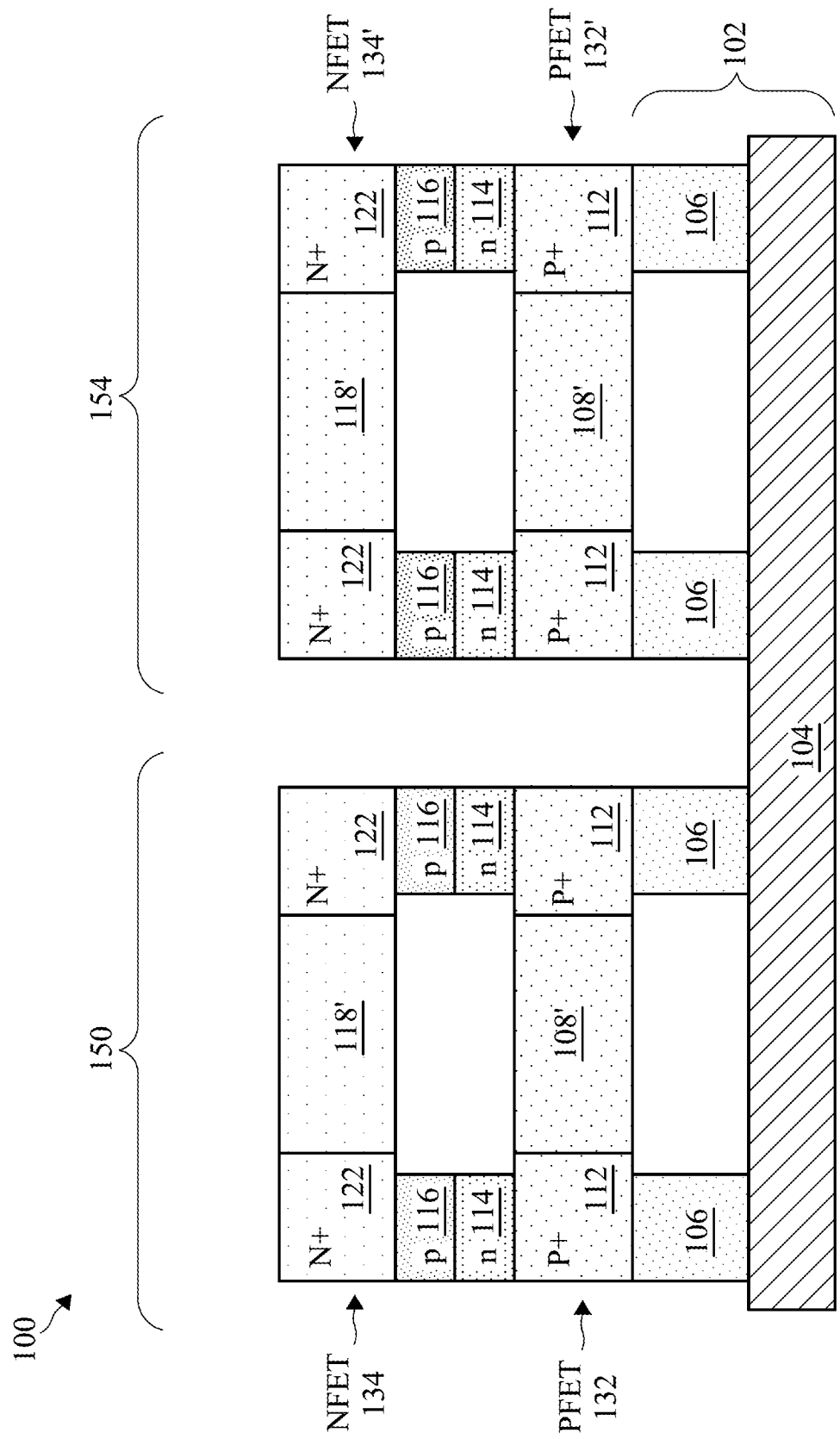
FIG. 25 is a cross-sectional view of a semiconductor device in accordance with some embodiments.
Figure 26:
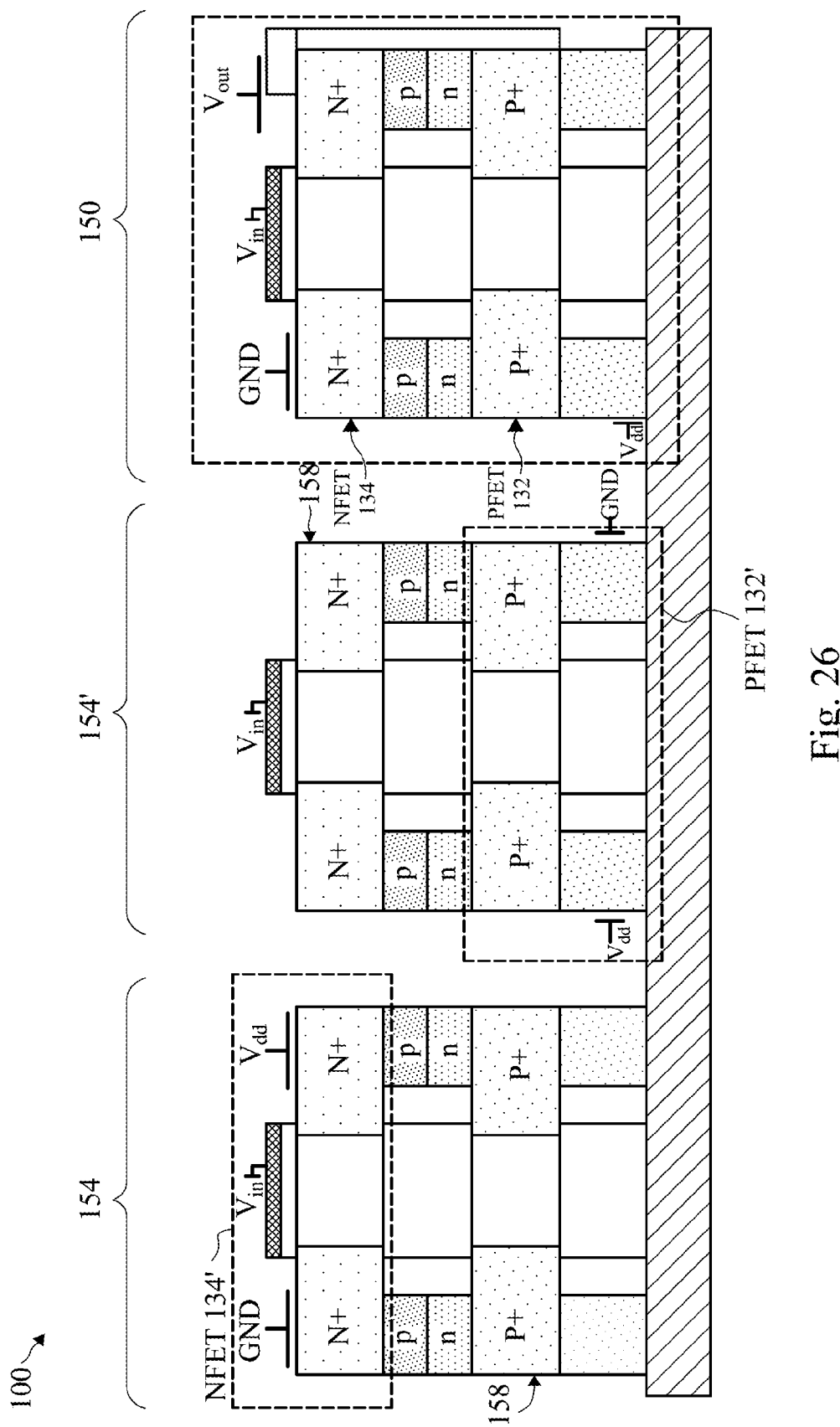
FIG. 26 is a cross-sectional view of a semiconductor device in accordance with some embodiments.

FIGS. 25 and 26 are cross-sectional views of a semiconductor device 100 in accordance with some embodiments. PFETs 132' and NFETs 134' may also be formed in other stacked regions 154 and 154' simultaneously with the formation of inverters in stacked regions 150, formed from the semiconductive material 106 of the substrate 102, and the first, second, third, and fourth semiconductive materials 108, 114, 116, and 118, using the same deposition, epitaxial growth, implantation, and etch processes previously described herein. Portions of the semiconductor device 100 may include dummy features 158 in some embodiments, as illustrated in FIG. 26. For example, stacked region 154 includes an NFET 134' disposed over a dummy feature 158 that is not electrically connected. Likewise, stacked region 154' includes a PFET 132' disposed beneath a dummy feature 158 that is not electrically connected. Electrical connections to ground (GND), voltage input (Vin), and voltage supply (Vdd) are illustrated for the NFET 134' and PFET 132'.

The additional PFETs 132' and NFETs 134' formed in non-stacked regions 152 or stacked regions 154 or 154' are also referred to herein, e.g., in some of the claims, as a third FinFET. The third FinFETs have source and drain regions that are formed when implanting source and drain regions of a first FinFET comprising a PFET 132 or that are formed when implanting source and drain regions of a second FinFET comprising an NFET 134. Forming the third FinFETs comprise forming non-stacked devices or stacked devices, for example.

Figure 27:
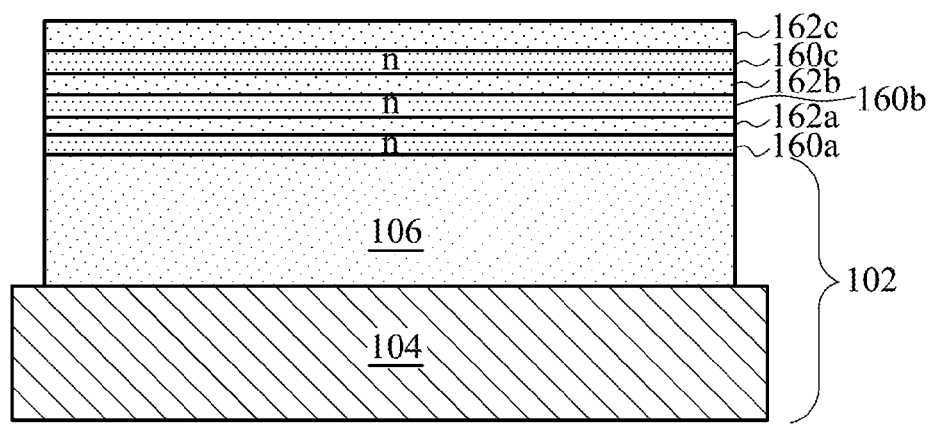
FIGS. 27 through 33 are cross-sectional views that illustrate a semiconductor device at various stages of manufacturing in accordance with some embodiments.

In some of the embodiments shown in FIGS. 1 through 11 and FIGS. 13 through 26, the PFETs 132 and NFETs 134 of the inverters comprise channel regions 108' and 118' that have single channels. In other embodiments, the channel regions of the PFETs and NFETs of the inverters may comprise multiple channels. In FIG. 11, multiple channels are shown that are formed in a horizontal direction. In other embodiments, multiple channels may be formed in a vertical direction. For example, FIGS. 27 through 33 are cross-sectional views of a semiconductor device 100 at various stages of manufacturing in accordance with some embodiments. In FIG. 27, a semiconductor device 100 comprises a substrate 102 including a semiconductive material 106 disposed over an insulator 104. To form a PFET having multiple channels, multiple semiconductive material layers 160a, 162a, 160b, 162b, 160c, and 162c are sequentially formed over the semiconductive material 106 of the substrate 102. The semiconductive material layers 160a, 162a, 160b, 162b, 160c, and 162c are epitaxially grown in some embodiments, for example. Alternating semiconductive material layers 160a, 162a, 160b, 162b, 160c, and 162c comprise the same material. For example, semiconductive material layers 160a, 160b, and 160c may comprise an n type material such as silicon doped with an n type dopant, and semiconductive material layers 162a, 162b, and 162c may comprise a similar material as described for the first semiconductive material 108 of the previous embodiments, such as SiGe, Ge, or a group III-V material. Semiconductive material layers 160a, 160b, and 160c may be in-situ doped with an n type material, for example. The semiconductive material layers 160a, 162a, 160b, 162b, 160c, and 162c may also comprise other materials and may be formed using other methods. The semiconductive material layers 160a, 162a, 160b, 162b, 160c, and 162c may each comprise a thickness of about 0.5 nm to about 10 nm, such as about 1 nm to about 7 nm, or other dimensions.

Figure 28:
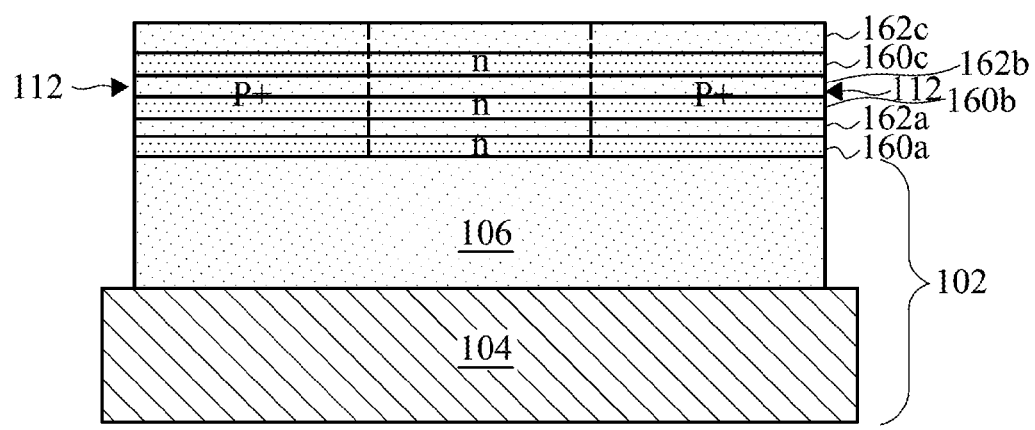
Figure 29:
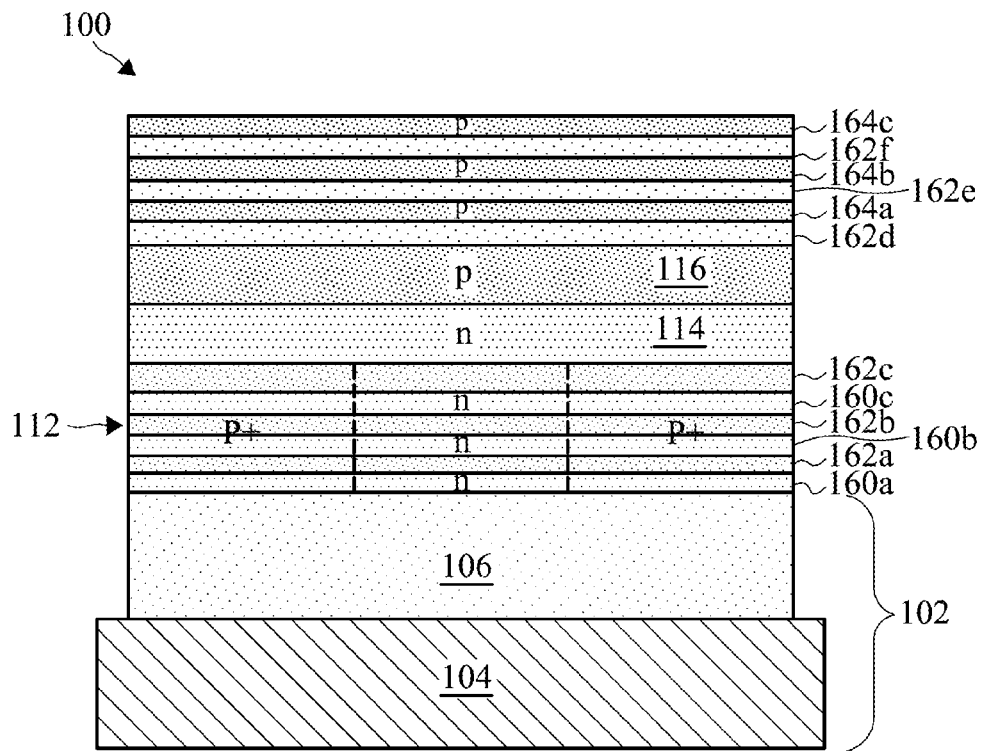

In FIG. 28, a mask (not shown) is deposited and patterned, and the semiconductive material layers 160a, 162a, 160b, 162b, 160c, and 162c are implanted with a P+ dopant to form source and drain regions 112, as described for the previous embodiments. The mask is then removed. In FIG. 29, the second semiconductive material 114 is formed over the upper-most semiconductive material layer 162c, and the third semiconductive material 116 is formed over the second semiconductive material 114. Semiconductive material layers 162d, 164a, 162e, 164b, 162f, and 164c are then sequentially formed over the third semiconductive material 116, also shown in FIG. 29. Semiconductive material layers 162d, 164a, 162e, 164b, 162f, and 164c may comprise similar materials and formation methods as described for semiconductive material layers 160a, 162a, 160b, 162b, 160c, and 162c, for example. Semiconductive material layers 164a, 164b, and 164c are in-situ doped with a p type material in some embodiments. The semiconductive material layers 162d, 164a, 162e, 164b, 162f, and 164c may each comprise a thickness of about 0.5 nm to about 10 nm, such as about 1 nm to about 7 nm, or other dimensions.

Figure 30:
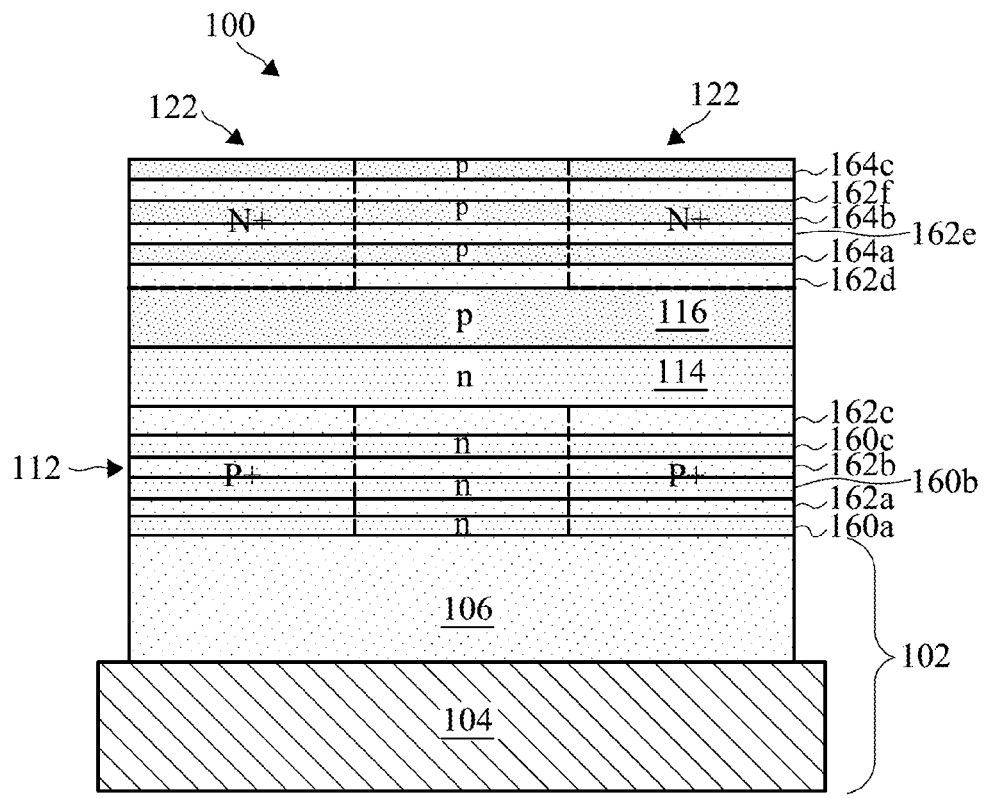
Figure 31:
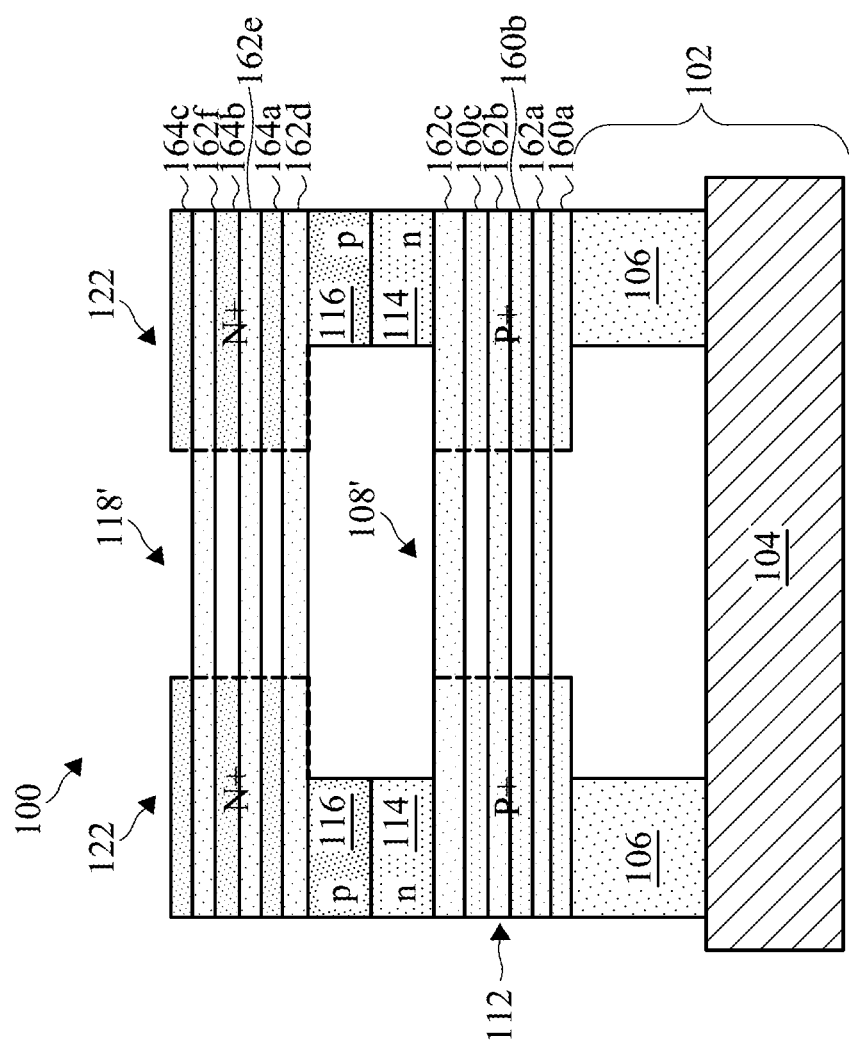
Figure 32:
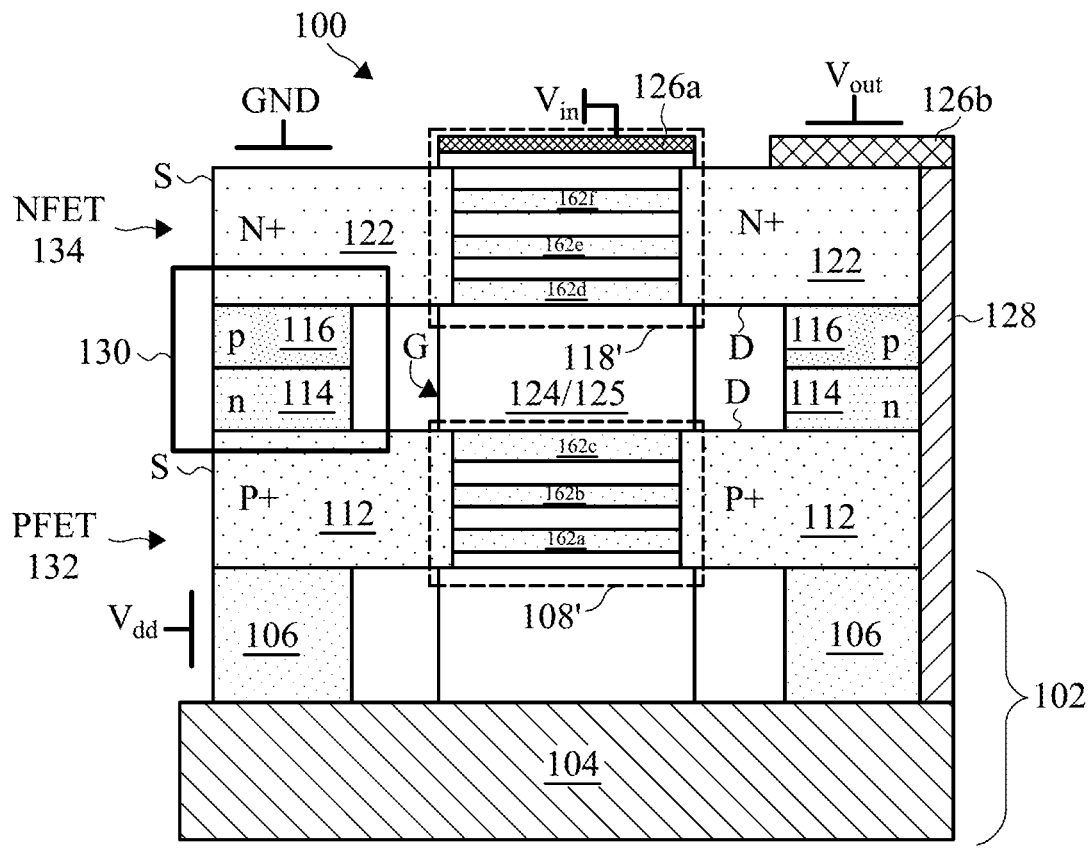

In FIG. 30, a mask (not shown) is deposited and patterned, and the semiconductive material layers 162d, 164a, 162e, 164b, 162f, and 164c are implanted to form source and drain regions 112, as described for the previous embodiments. The mask is then removed. The semiconductive material layers 162d, 164a, 162e, 164b, 162f, and 164c are implanted with an N+ dopant to form the source and drain regions 122, as described for the previous embodiments. In FIG. 31, a selective etch process is used to remove portions of material layers 160a, 160b, 160c, 164a, 164b, 164c, and the semiconductive material 106 of the substrate 102, leaving portions of semiconductive material layers 162a, 162b, 162c, 162d, 162e, and 162f remaining that form multiple channels of the PFET 132 and the NFET 134, as shown in FIG. 32. The gate dielectric 123, gate materials 124/125, and contacts 126a and 126b, and side contact 128 is formed, as shown in FIG. 32 and as described for the previous embodiments.

Figure 33:
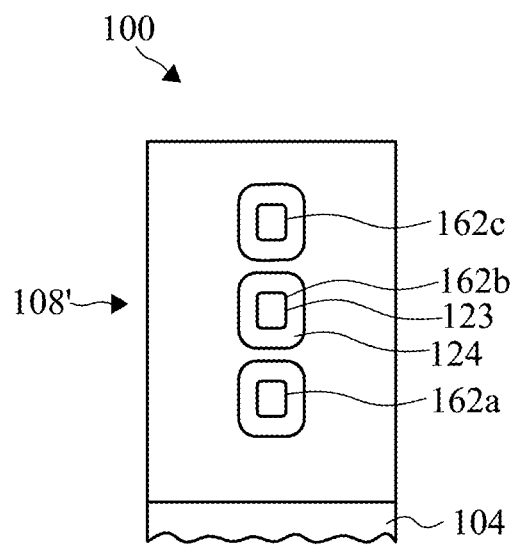

A cross-sectional view perpendicular to the view shown in FIG. 32 is shown in FIG. 33 of the channel region 108' of the PFET 132 shown in FIG. 32. The channel region 108' of the PFET 132 comprises three channels 162a, 162b, and 162c. The channel region 118' of the NFET 134 comprises a similar shape and three channels 162d, 162e, and 162f. A PFET 132 and NFET 134 comprising three channels is shown in the embodiments shown in FIGS. 27 through 33; however, an inverter comprising a stacked PFET 132 and NFET 134 may also comprise two channels or four or more channels, not shown. The PFET 132 and NFET 134 comprise the same number of channels in some embodiments. In other embodiments, the PFET 132 and NFET 134 of the inverter comprise a different number of channels.

Some advantages of some embodiments of the present disclosure include providing semiconductor devices comprising inverters with transistors comprising stacked FinFETs. The inverters comprise high mobility junction isolation 3D stacked FinFET CMOS devices with GAA channel structures. The inverters may be manufactured using cyclic sequential epitaxial growth and implantation processes, or using implantation processes after all of the epitaxial layers are formed. The fabrication of additional stacked or non-stacked FinFET devices in other regions may be integrated into the manufacturing process flow for the inverters. The inverters have superior circuit performance, and are adapted to operate at low voltages, such as about 0.7 Volts; e.g., about 1 Volt or less. By using epitaxial growth processes and selective etch processes to pattern and form channel regions, source and drain regions, and junction isolation regions or material of the transistors of the inverters, a need for through-substrate via (TSV) fabrication, complicated lithography alignment, wafer-to-wafer or chip-to-chip bonding, and high-aspect-ratio etch technologies are avoided, as examples.

The inverters achieve high speed and circuit performance. The junction isolation regions are self-aligned by the selective etch processes used for the various semiconductive material layers. The junction isolation regions are naturally pinched off and have low or no leakage current. The inverter manufacturing process comprises 3DIC technology, and results in higher yields. The inverters described herein comprise 3D stacked FinFET/nano-wire inverters with minimal physical dimensions and efficient layout usage. Furthermore, the manufacturing process flows and structures described herein are easily implementable in existing manufacturing process flows.

In some embodiments, a semiconductor device includes a first FinFET disposed over a substrate, a second FinFET disposed over the first FinFET, and a junction isolation material disposed between a source of the first FinFET and a source of the second FinFET.

In other embodiments, a semiconductor device includes a first semiconductive material disposed over a substrate. The first semiconductive material includes a first doped region comprising a source of a first FinFET, a second doped region comprising a drain of the first FinFET, and a channel region of the first FinFET disposed between the source and the drain. A junction isolation material is disposed over the source and drain of the first FinFET. A second semiconductive material is disposed over the junction isolation material and the first semiconductive material. The second semiconductive material includes a first doped region comprising a source of a second FinFET, a second doped region comprising a drain of the second FinFET, and a channel region of the second FinFET disposed between the source and the drain. A gate dielectric and a gate are disposed around the channel regions of the first FinFET and the second FinFET. The drains of the first FinFET and the second FinFET are coupled together. The first FinFET and the second FinFET comprise an inverter.

In other embodiments, a method of manufacturing a semiconductor device includes forming a first semiconductive material over a substrate, forming a second semiconductive material over the first semiconductive material, and forming a third semiconductive material over the second semiconductive material. A fourth semiconductive material is formed over the third semiconductive material. The method includes implanting a first dopant comprising a first dopant type into the first semiconductive material to form source and drain regions of a first FinFET, and implanting a second dopant comprising a second dopant type into the fourth semiconductive material to form source and drain regions of a second FinFET. Portions of the second semiconductive material and portions of the third semiconductive material comprise a junction isolation material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first semiconductive material over a substrate;
   forming a second semiconductive material over the first semiconductive material;
   forming a third semiconductive material over the second semiconductive material;
   forming a fourth semiconductive material over the third semiconductive material;
   implanting a first dopant comprising a first dopant type into the first semiconductive material to form source and drain regions of a first FinFET; and
   implanting a second dopant comprising a second dopant type into the fourth semiconductive material to form source and drain regions of a second FinFET, wherein portions of the second semiconductive material and portions of the third semiconductive material comprise a junction isolation material.

2. The method according to claim 1, further comprising patterning the first semiconductive material and the fourth semiconductive material to form the first FinFET and the second FinFET, respectively.

3. The method according to claim 2, wherein patterning the first semiconductive material and the fourth semiconductive material further comprises patterning the second semiconductive material and the third semiconductive material.

4. The method according to claim 2, wherein implanting the first dopant and implanting the second dopant comprises implanting the first dopant and implanting the second dopant after patterning the first semiconductive material and the fourth semiconductive material.

5. The method according to claim 2, wherein patterning the first semiconductive material and the fourth semiconductive material further comprises forming channel regions between the source and drain regions of the first FinFET and the second FinFET.

6. The method according to claim 5, wherein forming channel regions comprises forming a plurality of channels in the horizontal direction or in the vertical direction.

7. The method according to claim 2, further comprising:
   forming one or more insulating materials disposed over the substrate, wherein the one or more insulating materials is disposed over the first FinFET and over the second FinFET, and wherein the one or more insulating materials is adjacent to the first FinFET and to the second FinFET; and
   forming contacts through the one or more insulating materials and/or through the first FinFET and the second FinFET.

8. The method according to claim 1, wherein implanting the first dopant comprises implanting the first dopant after forming the first semiconductive material, and wherein implanting the second dopant comprises implanting the second dopant after forming the fourth semiconductive material.

9. The method according to claim 1, wherein implanting the first dopant and implanting the second dopant comprise implanting the first dopant and implanting the second dopant after forming the fourth semiconductive material.

10. The method according to claim 1, wherein implanting the first dopant into the first semiconductive material or implanting the second dopant into the fourth semiconductive material further comprises forming source and drain regions of a third FinFET.

11. The method according to claim 10, wherein the third FinFET comprises a non-stacked device or a stacked device.

12. The method according to claim 1, wherein implanting the first dopant into the first semiconductive material or implanting the second dopant into the fourth semiconductive material further comprises forming source and drain regions of a third FinFET and of a fourth FinFET, wherein the third FinFET comprises a stacked device, and wherein the fourth FinFET comprises a stacked device.

13. A method comprising:
   forming a first FinFET over a wafer, the first FinFET comprising a first source region and a first drain region;
   forming a second FinFET over the first FinFET, the second FinFET comprising a second source region and a second drain region; and forming a junction isolation region disposed over the first source and below the second source, the junction isolation region comprising a p-type region and an n-type region, wherein the p-type region is coupled to the n-type region.

14. The method according to claim 13, wherein:
forming the first FinFET comprises forming a first semiconductive layer over an insulating material;
forming the junction isolation region comprises forming a second semiconductive layer over the first semiconductive layer and forming a third semiconductive layer over the second semiconductive layer; and
forming the second FinFET comprises forming a fourth semiconductive layer over the third semiconductive layer.

15. The method according to claim 14, further comprising:
implanting a first dopant into the first semiconductive layer to form the first source region and the first drain region of the first FinFET;
implanting an n-type dopant into the second semiconductive layer to form the n-type region;
implanting a p-type dopant into the third semiconductive layer to form the p-type region; and
implanting a second dopant into the fourth semiconductive layer to form the second source region and the second drain region of the second FinFET.

16. The method according to claim 15, further comprising patterning the first semiconductive layer and the fourth semiconductive layer to form channel regions between the source and drain regions of the first FinFET and between the source and drain regions of the second FinFET.

17. A method comprising:
forming a first FinFET, wherein forming the first FinFET comprises:
forming a plurality of first semiconductive layers over a substrate;
doping one or more of the plurality of first semiconductive layers with a first dopant, wherein each of the one or more of the plurality of first semiconductive layers doped with the first dopant is spaced apart by one or more other layers;
implanting the plurality of first semiconductive layers with a second dopant to form a first source region and a first drain region;
forming a plurality of junction isolation layers, the junction isolation layers comprising a p-type region and an n-type region coupled to one another;
forming a second FinFET, wherein forming the second FinFET comprises:
forming a plurality of second semiconductive layers over the plurality of junction isolation layers;
doping one or more of the plurality of second semiconductive layers with a third dopant, wherein each of the one or more of the plurality of second semiconductive layers doped with the third dopant is spaced apart by one or more other layers;
implanting the plurality of second semiconductive layers with a fourth dopant to form a second source region and a second drain region;
etching to remove portions of the plurality of the first semiconductive layers to form one or more first channels, wherein the one or more first channels extend between the first source region and the first drain region;
etching to remove portions of the plurality of the second semiconductive layers to form one or more second channels, wherein the one or more second channels extend between the second source region and the second drain region; and
forming a gate dielectric and a gate material around each of the one or more first channels and each of the one or more second channels.

18. The method according to claim 17, wherein the plurality of first semiconductive layers and the plurality of second semiconductive layers comprise the same material.

19. The method according to claim 17, wherein the number of semiconductive layers in the plurality of first semiconductive layers is equal to the number of semiconductive layers in the plurality of second semiconductive layers.

20. The method according to claim 17, further comprising:
before forming the second FinFET, forming one or more semiconductive materials over the uppermost of the plurality of first semiconductive layers; and
the etching to remove the first channels and/or the etching to remove the second channels also removes portions of the one or more semiconductive materials.

\* \* \* \* \*